United States Patent
Koike et al.

(10) Patent No.: US 10,665,282 B2
(45) Date of Patent: May 26, 2020

(54) MEMORY CIRCUIT PROVIDED WITH VARIABLE-RESISTANCE ELEMENT

(71) Applicant: TOHOKU UNIVERSITY, Sendai-shi (JP)

(72) Inventors: Hiroki Koike, Sendai (JP); Tetsuo Endoh, Sendai (JP)

(73) Assignee: Tohoku University, Sendai-Shi (JP)

( * ) Notice: Subject to any disclaimer, the term of this patent is extended or adjusted under 35 U.S.C. 154(b) by 130 days.

(21) Appl. No.: 15/573,904

(22) PCT Filed: May 16, 2016

(86) PCT No.: PCT/JP2016/064531
§ 371 (c)(1),
(2) Date: Aug. 13, 2018

(87) PCT Pub. No.: WO2016/186086
PCT Pub. Date: Nov. 24, 2016

(65) Prior Publication Data
US 2018/0350419 A1 Dec. 6, 2018

(30) Foreign Application Priority Data
May 15, 2015 (JP) .................. 2015-100542

(51) Int. Cl.
*G11C 11/16* (2006.01)
(52) U.S. Cl.
CPC ........ *G11C 11/1697* (2013.01); *G11C 11/161* (2013.01); *G11C 11/1659* (2013.01); *G11C 11/1673* (2013.01); *G11C 11/1675* (2013.01)
(58) Field of Classification Search
CPC ............................. G11C 11/16; G11C 11/1675
(Continued)

(56) References Cited

U.S. PATENT DOCUMENTS

| 5,642,308 A * | 6/1997 | Yoshida | G11C 16/28 257/316 |
| 6,191,979 B1 * | 2/2001 | Uekubo | G11C 16/24 365/185.2 |

(Continued)

FOREIGN PATENT DOCUMENTS

| JP | 2002-197853 | 7/2002 |
| JP | 2003-281880 | 10/2003 |

(Continued)

OTHER PUBLICATIONS

Int'l. Search Report issued in Int'l. App. No. PCT/JP2016/064531, dated Aug. 2, 2016.

*Primary Examiner* — Michael T Tran
(74) *Attorney, Agent, or Firm* — Greer Burns & Crain Ltd.

(57) ABSTRACT

A memory circuit (11) includes: a memory cell ($MC_{ij}$) including a variable-resistance element in which a resistance value varies substantially between two levels; a resistance-voltage conversion circuit that converts the resistance value of a memory cell ($MC_{ij}$) to be read into a data voltage; a reference circuit ($RC_i$) including a series circuit of a variable-resistance element and a linear resistor, the variable-resistance element including substantially the same configuration as the configuration of the variable-resistance element included in the memory cell $MC_{ij}$ and being set to a lower resistance of two levels; a reference voltage conversion circuit that converts the resistance value of the reference circuit ($RC_i$) into a reference voltage; and a sense amplifier (SA) that determines data stored in the memory cell ($MC_{ij}$) by comparing the data voltage with the reference voltage.

10 Claims, 13 Drawing Sheets

(58) Field of Classification Search
USPC .................................................. 365/158, 173
See application file for complete search history.

(56) References Cited

U.S. PATENT DOCUMENTS

| | | | | |
|---|---|---|---|---|
| 8,565,004 B2* | 10/2013 | Iijima | G11C 11/5685 | 365/148 |
| 2001/0015906 A1* | 8/2001 | Schneider | G11C 11/22 | 365/145 |
| 2001/0033514 A1* | 10/2001 | Takata | G11C 7/14 | 365/189.07 |
| 2001/0053093 A1* | 12/2001 | Ogura | G11C 8/10 | 365/185.23 |
| 2002/0054515 A1* | 5/2002 | Kang | G11C 7/1045 | 365/189.05 |
| 2002/0191467 A1* | 12/2002 | Matsumoto | G11C 11/406 | 365/222 |
| 2004/0027904 A1* | 2/2004 | Morikawa | G11C 7/062 | 365/222 |
| 2004/0120200 A1* | 6/2004 | Gogl | G11C 7/067 | 365/210.1 |
| 2005/0030809 A1* | 2/2005 | Vimercati | G11C 7/067 | 365/222 |
| 2005/0195634 A1* | 9/2005 | Ishida | G11C 11/5614 | 365/148 |
| 2006/0067097 A1* | 3/2006 | Lien | G11C 11/22 | 365/49.13 |
| 2006/0083070 A1* | 4/2006 | Arakawa | G11C 16/28 | 365/185.21 |
| 2007/0159867 A1* | 7/2007 | Muraoka | G11C 11/5685 | 365/100 |
| 2008/0186776 A1* | 8/2008 | Kim | G11C 16/0483 | 365/185.23 |
| 2009/0010079 A1* | 1/2009 | Kang | G11C 11/404 | 365/189.09 |
| 2009/0268509 A1* | 10/2009 | Maejima | G11C 5/02 | 365/148 |
| 2010/0157654 A1* | 6/2010 | Jung | G11C 7/12 | 365/148 |
| 2011/0026348 A1* | 2/2011 | Narui | G11C 7/227 | 365/210.1 |
| 2012/0033506 A1* | 2/2012 | Furutani | G11C 5/147 | 365/189.07 |
| 2012/0163075 A1* | 6/2012 | Tanikawa | G11C 16/24 | 365/185.2 |
| 2012/0250437 A1* | 10/2012 | Nagata | G11C 7/18 | 365/200 |
| 2013/0163361 A1* | 6/2013 | Nomoto | G11C 5/147 | 365/203 |
| 2013/0223170 A1* | 8/2013 | Kajigaya | G11C 29/80 | 365/200 |
| 2013/0250654 A1* | 9/2013 | Sugimae | G11C 13/0002 | 365/148 |
| 2013/0268727 A1* | 10/2013 | Sohn | G11C 8/00 | 711/105 |
| 2013/0308403 A1* | 11/2013 | Nakai | G11C 7/12 | 365/203 |
| 2013/0329489 A1* | 12/2013 | Kim | G11C 11/1659 | 365/158 |
| 2014/0025866 A1* | 1/2014 | Kim | G06F 12/0246 | 711/103 |
| 2014/0050010 A1* | 2/2014 | Toda | G11C 13/004 | 365/148 |
| 2014/0056058 A1* | 2/2014 | Jefremow | G11C 11/1673 | 365/158 |
| 2014/0092680 A1* | 4/2014 | Lee | G11C 11/404 | 365/182 |
| 2014/0157065 A1* | 6/2014 | Ong | G11C 29/12 | 714/718 |
| 2014/0244930 A1* | 8/2014 | Lee | G11C 11/1673 | 711/118 |
| 2015/0003137 A1* | 1/2015 | Lee | G11C 13/004 | 365/49.1 |
| 2015/0035032 A1* | 2/2015 | Kang | H01L 27/228 | 257/295 |
| 2015/0037931 A1* | 2/2015 | Kuniya | H01L 45/04 | 438/104 |
| 2015/0049536 A1* | 2/2015 | Oh | G11C 13/003 | 365/148 |
| 2015/0070978 A1* | 3/2015 | Kim | G11C 11/1659 | 365/158 |
| 2015/0131387 A1* | 5/2015 | Jeon | G11C 16/08 | 365/185.29 |
| 2015/0146494 A1* | 5/2015 | Riho | G11C 11/40622 | 365/222 |
| 2015/0170730 A1* | 6/2015 | Antonyan | G11C 11/4099 | 365/189.07 |
| 2015/0194212 A1* | 7/2015 | Faraoni | G11C 13/0064 | 365/148 |
| 2015/0206584 A1* | 7/2015 | Tsai | G11C 13/0035 | 711/103 |
| 2015/0235703 A1* | 8/2015 | Sakimura | G11C 15/02 | 365/49.17 |
| 2015/0255165 A1* | 9/2015 | Tran | G11C 11/1673 | 365/185.11 |
| 2015/0279487 A1* | 10/2015 | Pious | G11C 29/44 | 365/96 |
| 2015/0332760 A1* | 11/2015 | Kim | G11C 11/1655 | 711/125 |
| 2015/0348624 A1* | 12/2015 | Jang | G11C 13/004 | 365/148 |
| 2016/0093800 A1* | 3/2016 | Matsunami | H01L 45/1233 | 257/4 |
| 2016/0180948 A1* | 6/2016 | Tanabe | G11C 16/0475 | 365/185.21 |
| 2016/0260482 A1* | 9/2016 | Sugimae | G11C 13/0097 | |

FOREIGN PATENT DOCUMENTS

| | | |
|---|---|---|
| JP | 2003-317467 | 11/2003 |
| JP | 2003-346475 | 12/2003 |
| JP | 2004-046962 | 2/2004 |
| JP | 2004-103202 | 4/2004 |
| JP | 2009-238327 | 10/2009 |
| JP | 2013-161502 | 8/2013 |

* cited by examiner

FIG. 7A  WLi  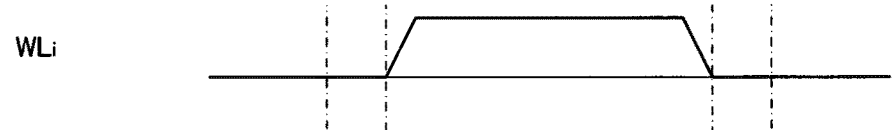
FIG. 7B  CLj, CLR  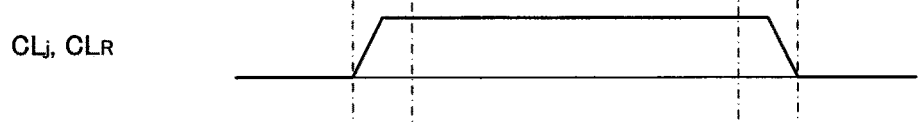
FIG. 7C  RE  
FIG. 7D  WBLH, WBLL WSLH, WSLL  
FIG. 7E  BLj  Vb  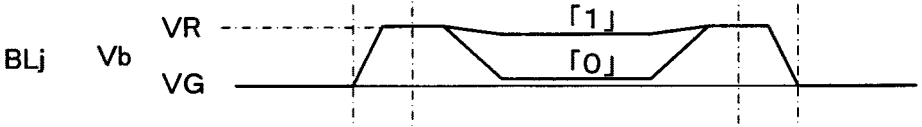
FIG. 7F  BLR  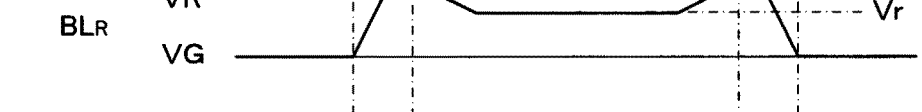
FIG. 7G  Data  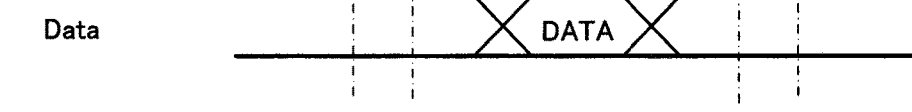

WRITING OF "0"
FIG. 8A  WLi 
FIG. 8B  CLj 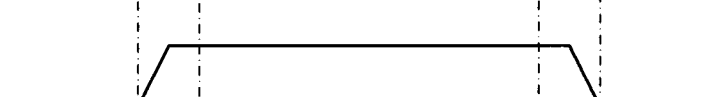
FIG. 8C  WBLH, WSLL 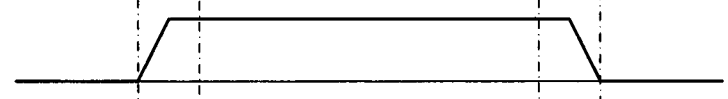
FIG. 8D  WBLL, WSLH 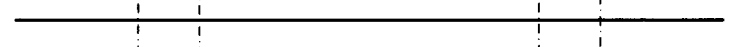
FIG. 8E  BLj 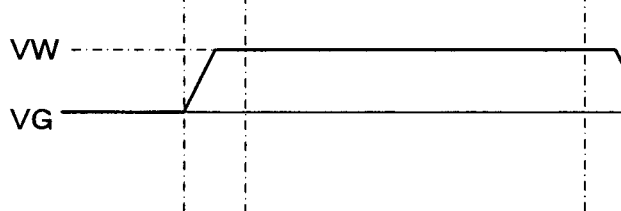
FIG. 8F  SLj 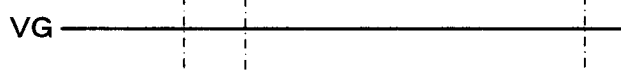

WRITING OF "1"
FIG. 9A  WLi 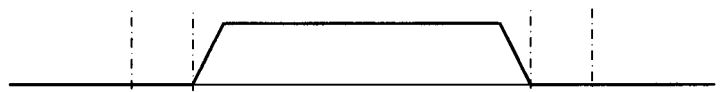
FIG. 9B  CLj 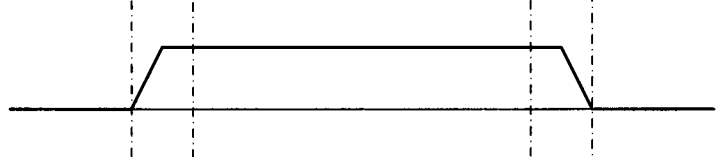
FIG. 9C  WBLH, WSLL 
FIG. 9D  WBLL, WSLH 
FIG. 9E  BLj 
FIG. 9F  SLj 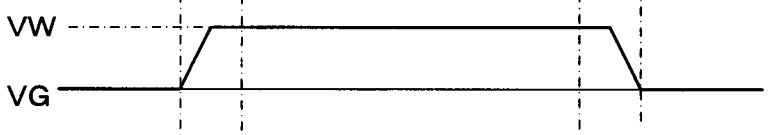

PERFORMANCE AT ROOM TEMPERATURE (25C)

PERFORMANCE AT HIGH TEMPERATURE (125C)

US 10,665,282 B2

MEMORY CIRCUIT PROVIDED WITH VARIABLE-RESISTANCE ELEMENT

This is a National Phase Application filed under 35 U.S.C. § 371, of International Application No. PCT/JP2016/064531, filed May 16, 2016, the contents of which are incorporated by reference.

TECHNICAL FIELD

This disclosure relates to a memory circuit including a variable-resistance element as a storage cell.

BACKGROUND ART

There have been developed memory circuits including a magnetoresistive element as a memory cell. Such a memory circuit compares the potential of a bit line varying according to data stored in a memory cell with a reference voltage to determine and output the stored data.

In a memory circuit disclosed in Patent Literature 1, a reference resistor $R_{ref}$ is used in order to generate a reference voltage. The reference resistor $R_{ref}$ includes a configuration with series connection of a circuit with parallel connection of two magnetoresistive elements in a parallel state and a circuit with parallel connection of two magnetoresistive elements in an antiparallel state. The parallel state means a state in which the magnetization directions of the pinned layers and free layers of the magnetoresistive elements are the same as each other, while the antiparallel state means a state in which the magnetization directions of the pinned layers and free layers of the magnetoresistive elements are opposite to each other.

In the reference resistor $R_{ref}$, $(R_p+R_{ap})/2$ is satisfied, in which $R_p$ is a resistance value in a case in which the magnetoresistive elements are in the parallel state, and $R_{ap}$ is a resistance value in a case in which the magnetoresistive elements are in the antiparallel state.

In addition, the memory circuit disclosed in Patent Literature 1 includes a resistor for adjustment. The resistor for adjustment is connected to the reference resistor $R_{ref}$ and has a resistance value half the resistance value of a bit line.

A memory circuit disclosed in Patent Literature 2 includes a configuration in which a reference cell is arranged in each row of a memory cell array. The memory circuit selects a reference cell in the same row as that of a memory cell to be accessed. The resistance value of each reference cell is set to an intermediate level between the resistance values $R_{max}$ and $R_{min}$ of a corresponding memory cell. In addition, Patent Literature 2 discloses, as a technique of setting the resistance value of a reference cell to such a value, a technique of writing stored data corresponding to a resistance value $R_{min}$ into a reference cell to adjust the size and gate voltage of a transistor for selection.

CITATION LIST

Patent Literature

Patent Literature 1: Unexamined Japanese Patent Application Kokai Publication No. 2002-197853

Patent Literature 2: Unexamined Japanese Patent Application Kokai Publication No. 2004-46962 (FIG. 10, paragraph 0058, and the like)

SUMMARY OF INVENTION

Technical Problem

The reference cell disclosed in Patent Literature 1 includes the four magnetoresistive elements and therefore has a complicated structure and a large element size. In addition, it is necessary to write two items of data into the four magnetoresistive elements included in the reference cell in an initial state. Therefore, the configuration and control of a write circuit are complicated and time-consuming. In addition, a wiring resistance varies because the length of a current path varies according to a memory cell to be accessed. Therefore, it is impossible to eliminate an influence due to a variation in wiring resistance merely by an adjusting resistance. Therefore, it may be impossible to correctly regenerate read data.

In the memory circuit disclosed in Patent Literature 2, it is necessary to correctly adjust the resistance value of a transistor for use in selection. However, the characteristics of the selection transistor greatly change due to a variation in a production process, and it is difficult to correctly set the resistance value of the selection transistor with a gate voltage and/or the like. Therefore, the resistance value of a reference cell varies, and a function as a criterion cell becomes unstable. Therefore, it may be impossible to correctly regenerate read data.

In addition, the memory circuit disclosed in Patent Literature 2 compares data (voltage) read from a storage cell to be read into a bit line with data read from a reference cell in the same row as that of the storage cell to be read into the bit line. As a result, the influences of the wiring resistances of the bit line and a source line are canceled out. However, the length of a transmission path varies from one column to another with regard to transmission of a signal in a column direction. Therefore, the influences of the wiring resistances may occur, and it may be impossible to correctly regenerate read data.

In each of the memory circuits disclosed in Patent Literature 1 and 2, the frequency of access to a reference cell is extremely greater than that of access to a storage cell. For example, when one reference cell is arranged per 1,000 storage cells, each reference cell is accessed on average 1,000 times more frequently than each storage cell. Therefore, rewriting (read disturb) of data due to a reading operation may occur. The occurrence of the read disturb makes it impossible to correctly regenerate read data.

The present disclosure was made under such actual circumstances with an objective to provide: a reference circuit that includes a simple configuration, allows an easy write operation, and can stably generate an appropriate reference voltage; and a memory circuit using the reference circuit.

Solution to Problem

In order to achieve the above-described objective, a memory circuit of the present disclosure includes: a memory cell including a variable-resistance element in which a resistance value varies substantially between two levels; a resistance-voltage conversion circuit that converts the resistance value of a memory cell to be read into a data voltage; a reference circuit including a series circuit of a variable-resistance element and a linear resistor, the variable-resistance element including substantially the same configuration as the configuration of the variable-resistance element included in the memory cell and being set to a lower resistance of two levels; a reference voltage conversion circuit that converts the resistance value of the reference circuit into a reference voltage; and a sense amplifier that determines data stored in the memory cell by comparing the data voltage with the reference voltage.

It is desirable that the variable-resistance element is settable to, for example, either a high resistance RH or a low resistance RL, and the linear resistor included in the reference circuit has a resistance value of more than 0 and less than a difference (RH−RL) between the high resistance RH and the low resistance RL. Further, it is desirable that when α is assumed to be the upper limit value of variations in the resistance value of a variable-resistance element, acceptable from the resolution of the sense amplifier, the resistance value of the linear resistor is substantially equal to (α/100)× RL.

For example, the memory cell may be arranged in the form of a matrix. The resistance-voltage conversion circuit may include a bit line, a load transistor connected to the bit line, and means of selecting a memory cell to be accessed, the bit line being arranged in each column of the matrix of the memory cells and being connected to a memory cell in a same column. The reference circuit may include the matrix of reference cells each including a series circuit of a variable-resistance element and the linear resistor, the variable-resistance element including the same configuration as the configuration of the variable-resistance element included in the memory cell and being set to a low resistance. The reference voltage conversion circuit may include a reference bit line connected to each of the reference cells, a reference load transistor connected to the reference bit line, and means of selecting a reference cell located apart from the reference load transistor by a distance corresponding to a distance between a memory cell to be accessed and the load transistor. The sense amplifier may compare the data voltage of the bit line with the reference voltage of the reference bit line.

For example, the memory cell may be arranged in the form of a matrix. The resistance-voltage conversion circuit may include a bit line, a load transistor connected to the bit line, and means of selecting a memory cell to be accessed, the bit line being arranged in each column of the matrix of the memory cells and being connected to a memory cell in a same column. The reference circuit may include the matrix of reference cells each including a variable-resistance element that includes the same configuration as the configuration of the variable-resistance element included in the memory cell and that is set to a low resistance; and the linear resistor. The reference voltage conversion circuit may include a reference bit line connected to each of the reference cells, a reference load transistor connected to the reference bit line, and means of selecting a reference cell located apart from the reference load transistor by a distance corresponding to a distance between a memory cell to be accessed and the load transistor. The sense amplifier may compare the data voltage of the bit line with the reference voltage of the reference bit line. The linear resistor may be interposed between a point connecting the reference bit line to a reference cell that is closest to a reference load transistor of the plural reference cells and a point connecting the reference bit line to the reference load transistor, or interposed between a common connection point of another end of a reference cell and a grounding end.

For example, the array of the reference cells may be arranged between memory cell arrays.

For example, the plural variable-resistance elements included in the reference circuit may include magnetic tunneling junction elements that are arranged to be oriented in the same direction. In this case, it is desirable that the magnetic tunneling junction elements included in the reference circuit are set to a low resistance by application of a magnetic field.

Advantageous Effects of Invention

According to the present disclosure, there can be provided: a reference circuit that includes a simple configuration, allows a simple write operation, and can stably generate an appropriate reference voltage; and a memory circuit using the reference circuit.

BRIEF DESCRIPTION OF DRAWINGS

FIG. 7A is a timing chart for explaining a reading operation of the memory circuit illustrated in FIG. 1;

FIG. 7B is a timing chart for explaining a reading operation of the memory circuit illustrated in FIG. 1;

FIG. 7C is a timing chart for explaining a reading operation of the memory circuit illustrated in FIG. 1;

FIG. 7D is a timing chart for explaining a reading operation of the memory circuit illustrated in FIG. 1;

FIG. 7E is a timing chart for explaining a reading operation of the memory circuit illustrated in FIG. 1;

FIG. 7F is a timing chart for explaining a reading operation of the memory circuit illustrated in FIG. 1;

FIG. 7G is a timing chart for explaining a reading operation of the memory circuit illustrated in FIG. 1;

FIG. 8A is a timing chart for explaining an operation of writing data "0" into a memory cell in the memory circuit illustrated in FIG. 1;

FIG. 8B is a timing chart for explaining an operation of writing data "0" into a memory cell in the memory circuit illustrated in FIG. 1;

FIG. 8C is a timing chart for explaining an operation of writing data "0" into a memory cell in the memory circuit illustrated in FIG. 1;

FIG. 8D is a timing chart for explaining an operation of writing data "0" into a memory cell in the memory circuit illustrated in FIG. 1;

FIG. 8E is a timing chart for explaining an operation of writing data "0" into a memory cell in the memory circuit illustrated in FIG. 1;

FIG. 8F is a timing chart for explaining an operation of writing data "0" into a memory cell in the memory circuit illustrated in FIG. 1;

FIG. 9A is a timing chart for explaining an operation of writing data "1" into a memory cell in the memory circuit illustrated in FIG. 1;

FIG. 9B is a timing chart for explaining an operation of writing data "1" into a memory cell in the memory circuit illustrated in FIG. 1;

FIG. 9C is a timing chart for explaining an operation of writing data "1" into a memory cell in the memory circuit illustrated in FIG. 1;

FIG. 9D is a timing chart for explaining an operation of writing data "1" into a memory cell in the memory circuit illustrated in FIG. 1;

FIG. 9E is a timing chart for explaining an operation of writing data "1" into a memory cell in the memory circuit illustrated in FIG. 1;

FIG. 9F is a timing chart for explaining an operation of writing data "1" into a memory cell in the memory circuit illustrated in FIG. 1;

DESCRIPTION OF EMBODIMENTS

A memory circuit according to an embodiment of the present disclosure will be described below with reference to the drawings.

Figure 1:
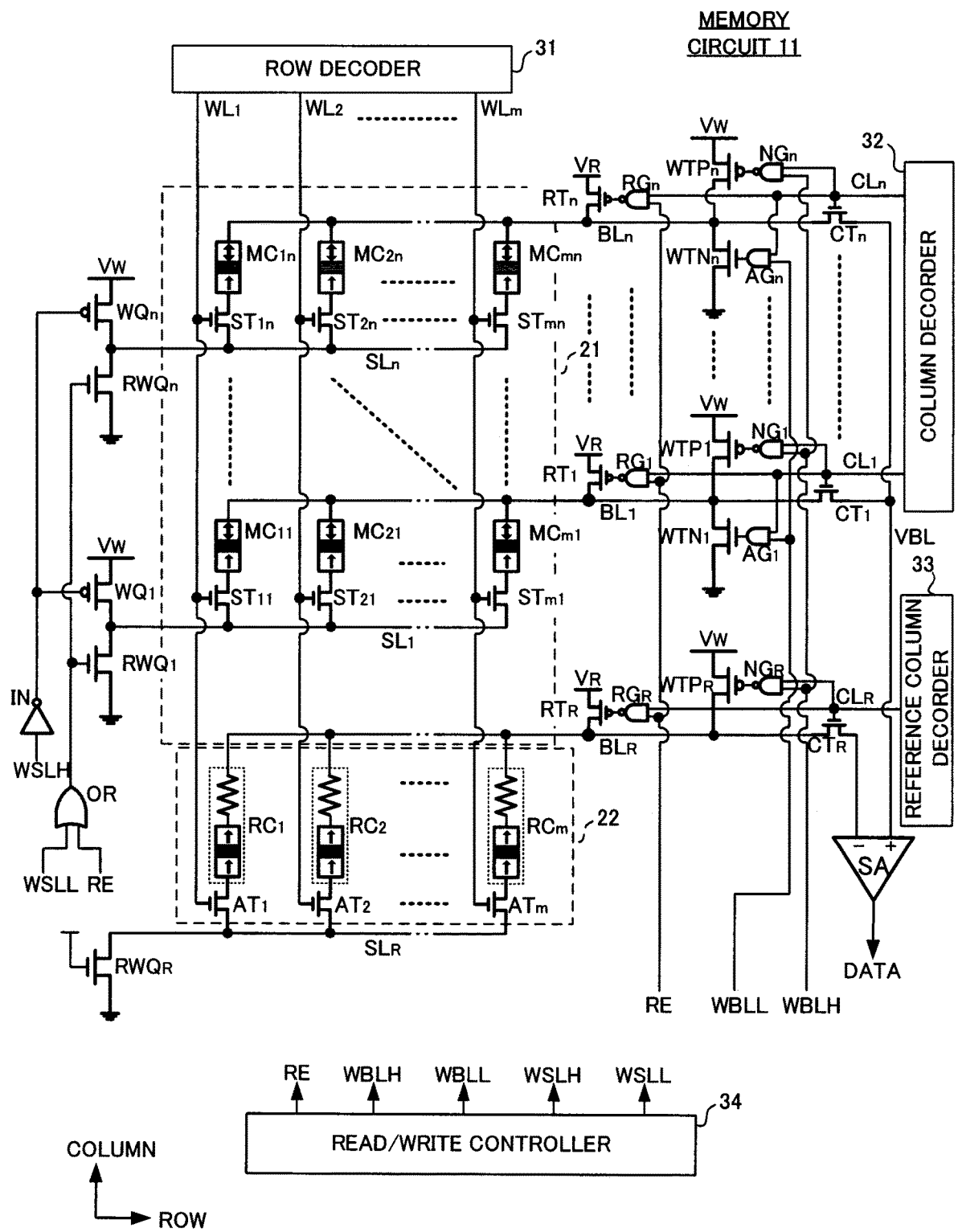
FIG. 1 is a block diagram of a memory circuit according to a first embodiment of the present disclosure.

FIG. 1 illustrates a configuration corresponding to one bit of a memory circuit 11 according to the present embodiment.

As illustrated, the memory circuit 11 includes a memory cell array 21 and a reference cell array 22.

The memory cell array 21 includes memory cells MC arrayed in a matrix form of m rows by n columns. Each of m and n represents a natural number. Hereinafter, a memory cell MC at row i and column j is expressed as a memory cell $MC_{ij}$ (i=1 to m, j=1 to n).

In contrast, the reference cell array 22 is arranged adjacently to the memory cell array 21 and includes reference cells RC arrayed in m rows by one column. Hereinafter, a reference cell RC at i row is expressed as a reference cell $RC_i$.

As illustrated in FIG. 1, one ends of the current paths of selection transistors $ST_{ij}$ are connected to one ends of corresponding memory cells $MC_{ij}$. In addition, one ends of the current paths of reference selection transistors $AT_i$ are connected to one ends of corresponding reference cells $RC_i$.

In the present embodiment, each of the selection transistors $ST_{ij}$ and the reference selection transistors $AT_i$ includes an N-channel MOS transistor.

The drains of the selection transistors $ST_{ij}$ are connected to the one ends of the corresponding memory cells $MC_{ij}$. The drains of the reference selection transistors $AT_i$ are connected to the one ends of the corresponding reference cells $RC_i$.

The other ends of the memory cells $MC_{ij}$ at column j are connected in common to a bit line $BL_j$ arranged at column j.

The other ends of the reference cells $RC_i$ are connected in common to a reference bit line $BL_R$.

The other ends of the current paths of the selection transistors $ST_{ij}$ at column j, connected to the memory cells $MC_{ij}$ at column j, are connected in common to a source line $SL_j$ arranged at column j.

The other ends of the current paths of the reference selection transistors $AT_i$ connected to the reference cells $RC_i$ are connected in common to a reference source line $SL_R$.

The gates of the selection transistors $ST_{ij}$ and reference selection transistors $AT_i$ at row i are connected in common to a word line $WL_i$ at row i.

The bit lines $BL_1$ to $BL_n$ include respective metal layers, for example, aluminum layers or copper layers, of which the materials, widths, and thicknesses are similar to each other. One ends of the bit lines $BL_j$ are connected in common to a vertical bit line VBL via the current paths of column selection transistors $CT_j$. The bit lines $BL_1$ to $BL_n$ include relatively thin conductor lines and therefore form a distributed resistance circuit.

The vertical bit line VBL is connected to the positive input terminal (+) of a sense amplifier SA. The vertical bit line VBL has a larger cross section than the cross section of each of the bit lines $BL_1$ to $BL_n$ and has a lower resistance value per unit length than the resistance value per unit length of each of the bit lines BL.

The reference cells $RC_1$ to $RC_m$ function as a reference circuit that provides a criterion resistance value in a reading operation and are connected in common to the reference bit line $BL_R$. The reference bit line $BL_R$ includes a metal layer of which the material, width, and thickness are similar to those of the bit lines $BL_1$ to $BL_n$, and exhibits electrical characteristics similar to the electrical characteristics of the bit lines $BL_1$ to $BL_n$. One end of the reference bit line $BL_R$ is connected to the negative input terminal (−) of the sense amplifier SA via the current path of a reference column selection transistor $CT_R$.

The column selection transistors $CT_1$ to $CT_n$ and the reference column selection transistor $CT_R$ have the same size and characteristics as each other.

One end of the current path of a reading load transistor $RT_j$ is connected to the bit line $BL_j$ at column j. A read voltage VR is applied to the other end of the current path of the reading load transistor $RT_j$. The reading load transistor $RT_j$ is a load transistor that functions as a load when data is read.

One end of the current path of a writing transistor $WTP_j$ and one end of the current path of a writing transistor $WTN_j$ are further connected to the bit line $BL_j$. A write voltage VW is applied to the other end of the current path of the writing transistor $WTP_j$. In contrast, the other end of the current path of the writing transistor $WTN_j$ is grounded. The writing transistor $WTP_j$ includes a P-channel MOS transistor, and the writing transistor $WTN_j$ includes an N-channel MOS transistor.

One end of the current path of a reference reading load transistor $RT_R$ is connected to the reference bit line $BL_R$ connected to the reference cells RC. A read voltage VR is applied to the other end of the current path of the reference reading load transistor $RT_R$. The reference reading load transistor $RT_R$ functions as a load when data is read, and has the same size and characteristics as the size and characteristics of each of the reading load transistors $RT_1$ to $RT_n$.

One end of the current path of a reference writing transistor $WTP_R$ is further connected to the reference bit line $BL_R$. A write voltage VW is applied to the other end of the current path of the reference writing transistor $WTP_R$. The reference writing transistor $WTP_R$ is a transistor for writing data "0" into the reference cells RC. The reference writing transistor $WTP_R$ is a configuration that need not be disposed when data "0" is written into the reference cells RC only by application of an external magnetic field.

A configuration corresponding to each of the writing transistors WTN is not connected to the reference bit line $BL_R$. This is because data "1" is not written into the reference cells RC.

One ends of the current paths of writing transistors $WQ_j$ and one ends of the current paths of reading/writing transistors $RWQ_j$ are connected to the corresponding source lines $SL_j$. Write voltages VW are applied to the other ends of the current paths of the writing transistors $WQ_j$. In contrast, the other ends of the current paths of the reading/writing transistors $RWQ_j$ are grounded. The writing transistors $WQ_j$ each include a P-channel MOS transistor and have the same size and characteristics as the size and characteristics of each of the writing transistors $WTP_1$ to $WTP_n$. The reading/writing transistors $RWQ_j$ each include an N-channel MOS transistor and have the same size and characteristics as each other.

The reference source line $SL_R$ is grounded via the current path of a reference reading/writing transistor $RWQ_R$. The reference reading/writing transistor $RWQ_R$ includes an N-channel MOS transistor and has the same size and characteristics as the size and characteristics of each of the reading/writing transistors $RWQ_1$ to $RWQ_n$. The gate of the reference reading/writing transistor $RWQ_R$ is pulled up.

The word lines $WL_1$ to $WL_m$ are connected to a row decoder 31.

Column lines $CL_1$ to $CL_n$ are connected to a column decoder 32.

A column line $CL_j$ is connected to one input terminal of a NAND gate $RG_j$ at the same column. A read enable signal RE is supplied to the other input terminal of the NAND gate $RG_j$. The NAND gate $RG_j$ outputs an output signal of low level to the gate of the corresponding reading load transistor $RT_j$ when both the voltage of the column line $CL_j$ and the read enable signal RE are at high levels. In other words, when the memory cell $MC_j$ at column j is selected and an instruction to read data is provided, the NAND gate $RG_j$ outputs a signal of low level to the gate of the reading load transistor $RT_j$ at the same column. As a result, the reading load transistor $RT_j$ is turned on.

The column line $CL_j$ is connected to one input terminal of a NAND gate $NG_j$ at the same column. A writing control signal WBLH is supplied to the other input terminal of the NAND gate $NG_j$. The NAND gate $NG_j$ outputs an output signal of low level to the gate of the corresponding writing transistor $WTP_j$ when both the voltage of the column line $CL_j$ and the writing control signal WBLH are at high levels. In other words, when the memory cell $MC_j$ at column j is selected and an instruction to write data "0" is provided, the NAND gate $NG_j$ outputs an output signal of low level to the gate of the corresponding writing transistor $WTP_j$. As a result, the writing transistor $WTP_j$ is turned on.

The column line $CL_j$ is connected to one input terminal of an AND gate $AG_j$ at the same column. A writing control signal WBLL is supplied to the other input terminal of the AND gate $AG_j$. The AND gate $AG_j$ outputs an output signal of high level to the gate of the writing transistor $WTN_j$ at the same column when both the voltage of the column line $CL_j$ and the writing control signal WBLL are at high levels. In other words, when the memory cell $MC_j$ at column j is selected and an instruction to write data "1" is provided, the AND gate $AG_j$ outputs an output signal of high level to the gate of the writing transistor $WTP_j$ at the same column. As a result, the writing transistor $WTN_j$ is turned on.

The column line $CL_h$ is further connected to the gate of the column selection transistor $CT_j$ at the same column. Therefore, the column selection transistor $CT_j$ is turned on when the column line $CL_h$ is at a high level, that is, when column j is selected.

A reference column line $CL_R$ is connected to a reference column decoder 33.

The reference column line CLR is connected to one input terminal of a reference NAND gate $RG_R$. The read enable signal RE is supplied to the other input terminal of the reference NAND gate $RG_R$. The reference NAND gate $RG_R$ outputs an output signal of low level to the gate of the reference reading load transistor $RT_R$ when both the voltage of the reference column line $CL_R$ and the read enable signal RE are at high levels. As a result, the reference reading load transistor $RT_R$ is turned on.

The reference column line $CL_R$ is connected to one input terminal of a reference NAND gate $NG_R$. The writing control signal WBLH is supplied to the other input terminal of the reference NAND gate $NG_R$. The reference NAND gate $NG_R$ outputs an output signal of low level to the gate of the reference writing transistor $WTP_R$ when both the voltage of the reference column line $CL_R$ and the writing control signal WBLH are at high levels. In other words, when a reference cell $RC_i$ is selected and an instruction to write data "0" is provided, the reference NAND gate $NG_R$ outputs an output signal of low level to the gate of the reference writing transistor $WTP_R$. As a result, the reference writing transistor $WTP_R$ is turned on.

The reference column line $CL_R$ is connected to the gate of the reference column selection transistor $CT_R$. Therefore, the reference column selection transistor $CT_R$ is turned on when the reference column line $CL_R$ is at a high level.

A writing signal WSLH is applied, via an inverter IN, to the gate of the writing transistor $WQ_j$ connected to the source line $SL_j$ at column j. Therefore, the writing transistor $WQ_j$ is turned on when the writing control signal WSLH is at a high level, that is, when "1" is written into the memory cell $MC_j$.

The output terminal of an OR gate OR is connected to the gate of the reading/writing transistor $RWQ_j$ connected to the source line $SL_j$ at column j. The read enable signal RE is supplied to one input terminal of the OR gate OR, while a writing control signal WSLL is supplied to the other input terminal. The OR gate OR outputs a signal of high level when at least one of the read enable signal RE and the writing control signal WSLL is at a high level, that is, at the time of reading or at the time of writing "0" into such a memory cell. As a result, the reading/writing transistors $RWQ_1$ to $RWQ_n$ are turned on.

According to instructions from a higher-level device that is not illustrated, a read/write controller 34 sets the read enable signal RE at a high level when data is read, sets the writing control signals WBLH and WSLL at high levels when data "0" is written, and sets the writing control signals WBLL and WSLH at high levels when data "1" is written.

The sense amplifier SA compares the voltage (data voltage) Vb of the vertical bit line VBL with the reference voltage $V_{ref}$ of the reference bit line $BL_R$. The sense amplifier SA outputs a DATA signal of low level if the data voltage of the vertical bit line VBL is lower than the reference voltage $V_{ref}$, and outputs a DATA signal of high level if the data voltage of the vertical bit line VBL is higher than the reference voltage $V_{ref}$. The sense amplifier SA includes, for example, an amplifier circuit having a high input impedance including a MOS circuit and/or the like.

Such a memory cell $MC_{ij}$ will now be described.

The memory cell $MC_{ij}$ includes one magnetic tunneling junction (MTJ) element. The MTJ element includes three layers of a pinned (fixed) layer MP, an insulating layer MI, and a free layer MF, as illustrated in portion A of FIG. 2A.

The pinned layer MP and the free layer MF are formed of a material such as a ferromagnetic body (for example, CoFeB) or a ferromagnetic Heusler alloy (for example, $Co_2FeAl$ or $Co_2MnSi$).

The magnetization direction of the pinned layer MP is fixed, and passage of a current through the layer does not result in a change in the magnetization direction. In contrast, the magnetization direction of the free layer MF can be changed, and passage of a current through the layer results in a change in the magnetization direction.

The insulating layer MI is a thin film disposed between the pinned layer MP and the free layer MF. The insulating layer MI includes, for example, a material such as magnesium oxide (MgO), alumina ($Al_2O_3$), or spinel single crystal ($MgAl_2O_4$).

Figure 2A:
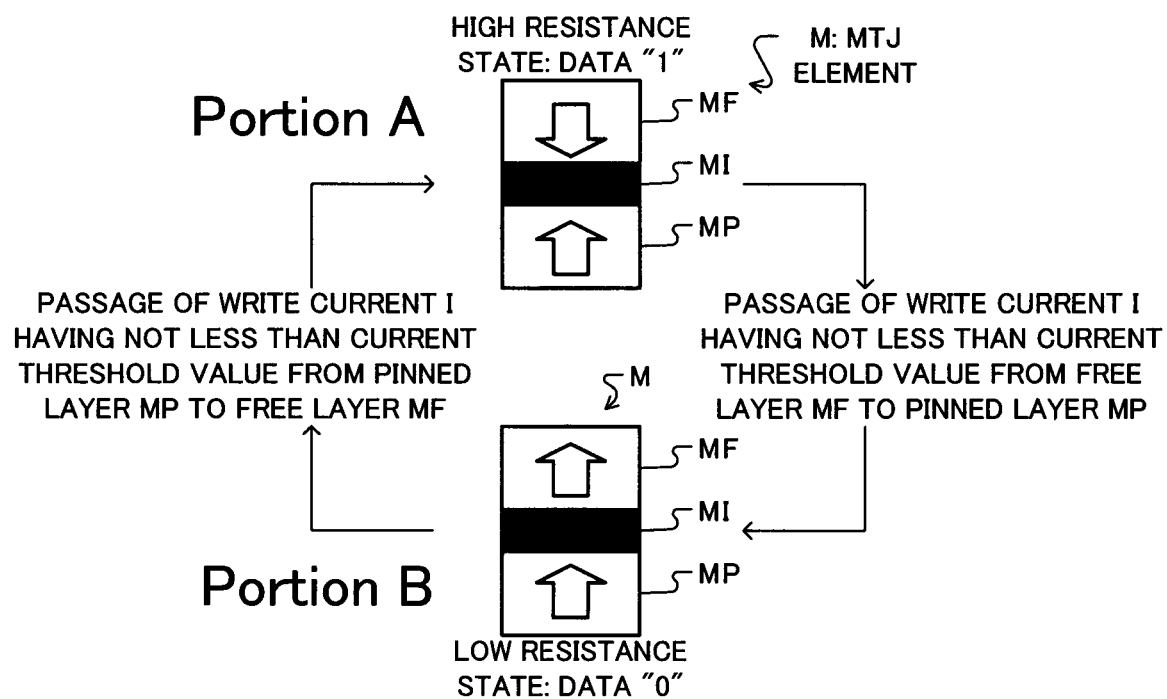
FIG. 2A is a diagram in which portion A illustrates a configuration of a magnetic tunneling junction (MTJ) element in a high resistance state, whereas portion B illustrates a configuration of an MTJ element in a low resistance state.

When the magnetization direction of the free layer MF is changed relatively with respect to the magnetization direction of the pinned layer MP, the resistance value of the MTJ element M is changed. Portion B of FIG. 2A illustrates a state in which the magnetization directions of the pinned layer MP and the free layer MF are the same as each other (parallel state). Portion A of FIG. 2A illustrates a state in which the magnetization directions of the pinned layer MP and the free layer MF are not the same (antiparallel state). The resistance value $R_p$ of the MTJ element M in the parallel state is less than the resistance value $R_{ap}$ of the MTJ element M in the antiparallel state. The resistance state of the MTJ element M in the parallel state is called a low resistance state, while the resistance state of the MTJ element M in the antiparallel state is called a high resistance state.

A writing current I having a current value (current threshold value) required for inverting the magnetization direction is allowed to pass through the MTJ element M in order to switch the resistance state of the MTJ element M. When the MTJ element M is in the high resistance state, passage of a writing current I having not less than the current threshold value from the free layer MF to the pinned layer MP causes the magnetization direction of the free layer MF to be inverted and results in the state in which the magnetization directions of the free layer MF and the pinned layer MP are the same as each other. In other words, the MTJ element M is switched to the low resistance state, and the resistance value of the MTJ element M becomes $R_p$.

In contrast, when the MTJ element M is in the low resistance state, passage of a writing current I having not less than the current threshold value from the pinned layer MP to the free layer MF causes the magnetization direction of the free layer MF to be inverted and results in the state in which the magnetization directions of the free layer MF and the pinned layer MP are opposite to each other. In other words, the resistance state of the MTJ element M is switched to the high resistance state, and the resistance value of the MTJ element M becomes $R_{ap}$.

In the present embodiment, the low resistance state of the MTJ element M is associated with data "0", and the high resistance state of the MTJ element M is associated with data "1." Therefore, a change of the MTJ element M from the high resistance state to the low resistance state demonstrates that data "0" is written into the memory cell MC. A change of the MTJ element M from the low resistance state to the high resistance state demonstrates that data "1" is written into the memory cell MC.

Figure 2B:
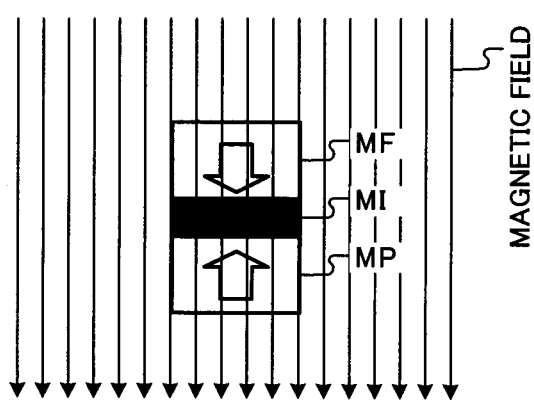
FIG. 2B is a view illustrating a technique of setting an MTJ element to a high resistance state by applying an external magnetic field.
Figure 2C:
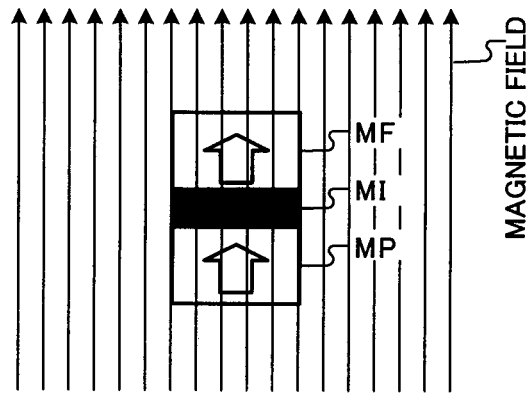
FIG. 2C is a view illustrating a technique of setting an MTJ element to a low resistance state by applying an external magnetic field.

An external magnetic field also enables data to be written into the MTJ element M. The MTJ element M can be set in the high resistance state (data "1") by, for example, externally applying a magnetic field in a direction opposite to the magnetization direction of the pinned layer MP, as illustrated in FIG. 2B. The MTJ element M can be set in the low resistance state (data "0") by externally applying a magnetic field in the same direction as the magnetization direction of the pinned layer MP, as illustrated in FIG. 2C.

Such a reference cell $RC_i$ will now be described.

Figure 3:
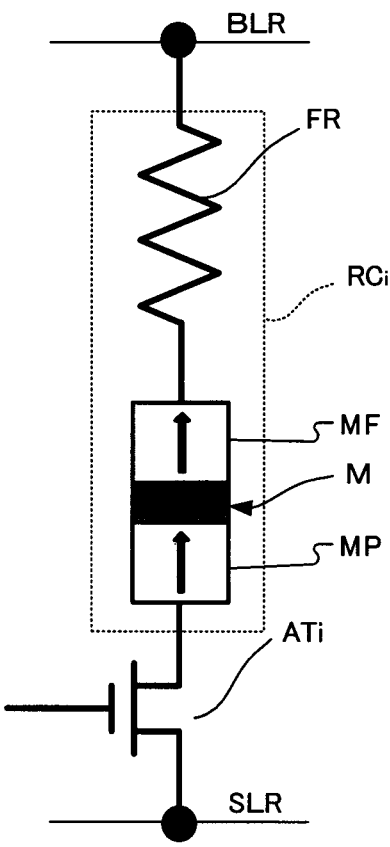
FIG. 3 is a view illustrating a configuration of a reference cell illustrated in FIG. 1.

The reference cell $RC_i$ includes a series circuit of one MTJ element M and one fixed resistor FR, as illustrated in FIG. 3. The MTJ element M includes the same structure (material, size, impurity concentration, and the like) as the structure of the MTJ element included in the memory cell $MC_{ij}$. However, the MTJ element M is set in a low resistance state (parallel state) in which the magnetization directions of a pinned layer MP and a free layer MF are the same as each other, as illustrated in portion B of FIG. 2A.

Figure 4A:
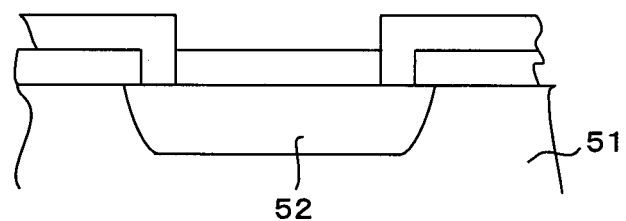
FIG. 4A is a view illustrating a configuration example of a fixed resistor (linear resistor)
Figure 4B:
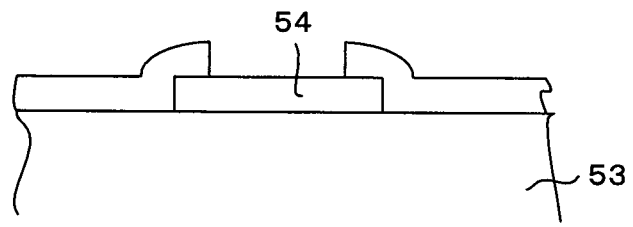
FIG. 4B is a view illustrating a configuration example of a fixed resistor (linear resistor)

The fixed resistor FR is a highly precise linear resistor including, for example, a diffusion layer 52 formed by diffusing an impurity in a semiconductor layer 51 or a polycrystalline silicon layer 54 formed on a substrate 53, as schematically illustrated in FIGS. 4A and 4B.

The resistance value $R_{offset}$ of the fixed resistor FR is set to a value that is more than 0 and less than $R_{ap} - R_p$ ($= R_p \times MR$ ratio). The MR ratio is the rate of change of the resistance of the MTJ element (Rap−Rp)/Rp.

The resistance value $R_{offset}$ of the fixed resistor FR is further set to a value that allows a difference between a data voltage Vb transmitted to the positive (noninverting) input terminal of the sense amplifier SA and a reference voltage $V_{ref}$ applied to the negative (inverting) input terminal of the sense amplifier SA at the time of reading data to be equal to or more than the resolution of the sense amplifier SA. The resolution of the sense amplifier SA means a minimum difference value which can be sensed by the sense amplifier SA between the voltage of the positive input terminal and the voltage of the negative input terminal. In a reading operation, the data voltage Vb is transmitted to the positive input terminal via the vertical bit line VBL, and the reference voltage $V_{ref}$ is applied to the negative input terminal via the reference bit line BLR, as described above. In other words, $R_{offset}$ is set to $R_{offset} = (\alpha/100) \times R_p$ using the acceptable upper limit value α (%) of variations in the MTJ element, at which a sense amplification operation can be accurately performed with the resolution of the sense amplifier SA. In this case, the reference resistance value of the circuit of FIG. 3 is $R_p + (\alpha/100) \times R_p$ in total.

When a read current passes, the MTJ element M of each reference cell RC is connected so that the low resistance state of the MTJ element M is maintained. For example, in the configuration of the present embodiment in which the voltage of the reference bit line $BL_R$ is set to be higher than that of the reference source line $SL_R$ at the time of reading, the free layer MF is connected to a portion closer to the reference bit line $BL_R$ while the pinned layer MP is connected to a portion closer to the reference source line $SL_R$.

The reading load transistor $RT_j$, the bit line $BL_j$, the selection transistor $ST_{ij}$, the source line $SL_j$, and the reading/writing transistor $RWQ_j$ function as a resistance-voltage conversion circuit that converts the resistance of the memory cell $MC_{ij}$ to be accessed into a voltage.

The reference cell array 22 functions as a reference circuit that provides a criterion resistance value in the case of reading data stored in the memory cell $MC_{ij}$. The reference cell array 22 includes the series circuit of the MTJ and the fixed resistor FM, the MTJ including the same configuration as the configuration of the MTJ included in the memory cell MCij and being set to a low resistance $R_p$. The reference reading load transistor $RT_R$, the reference bit line $BL_R$, the reference selection transistor $AT_i$, the reference source line $SL_R$, and the reference reading/writing transistor $RWQ_R$ select the reference cell $RC_i$ located apart from the reference reading load transistor $RT_R$ by a distance corresponding to a distance between the memory cell $MC_{ij}$ to be accessed and the reading load transistor $RT_j$, and function as a reference voltage conversion circuit that converts, into a reference voltage $V_{ref}$, a criterion resistance value provided by the selected reference cell $RC_i$.

The MTJ element included in the above-described memory cell $MC_{ij}$ and the MTJ element included in the reference cell $RC_i$ are produced in the same production process. In addition, the transistors $ST_{ij}$, $AT_i$, $RT_j$, $RT_R$, $WTP_j$, $WTP_R$, $WTN_j$, $WQ_j$, $RWQ_j$, $RWQ_R$, $CT_j$, and $CT_R$ are formed in the same production process. The bit lines, the word lines, and the source lines are also produced in the same process. Therefore, all the components are approximately equally affected by, for example, an error occurring in a production step.

Figure 5:
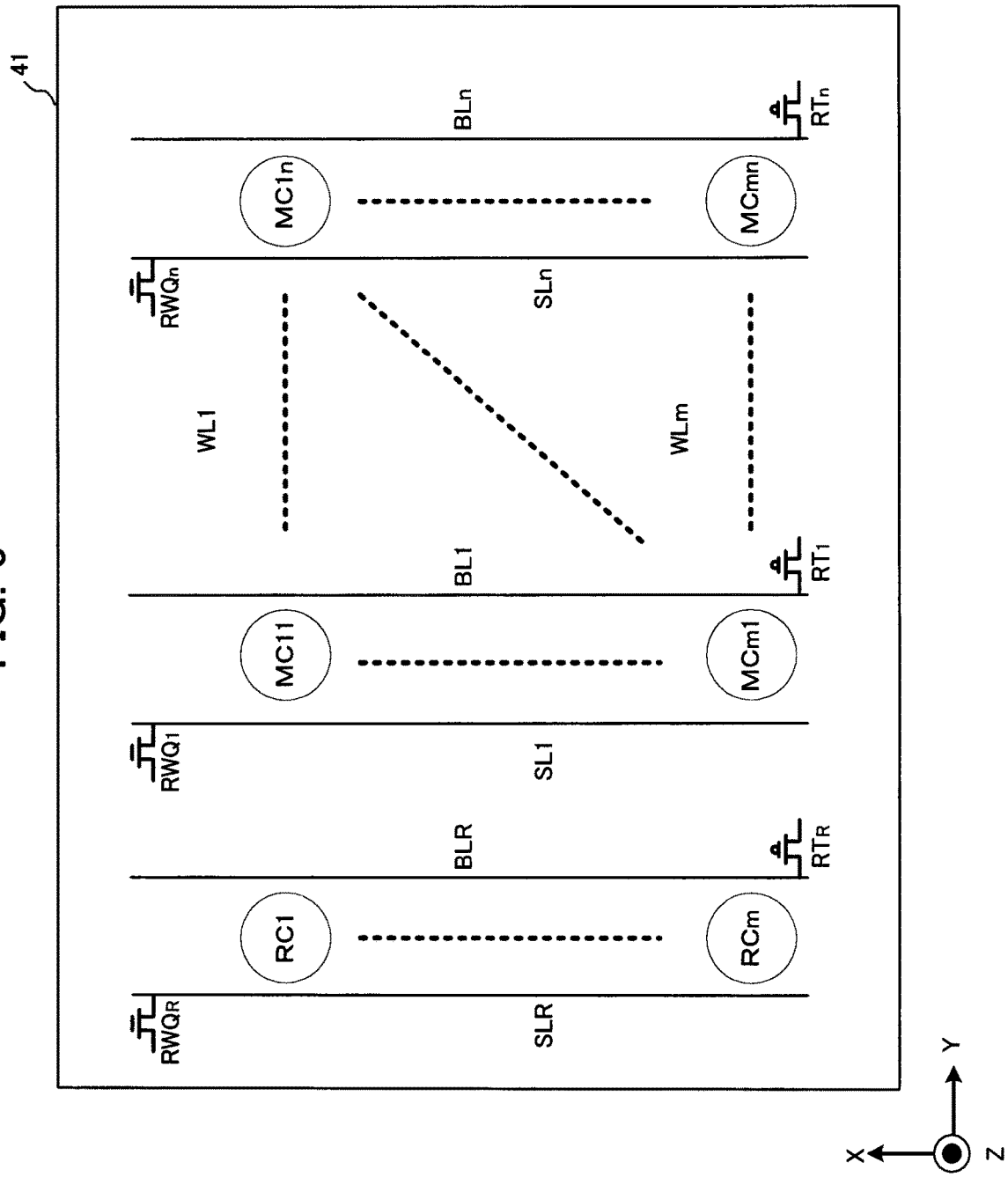
FIG. 5 is a view for explaining an arrangement on a space of the memory cells illustrated in FIG. 1.

As schematically illustrated in FIG. 5, the memory cells $MC_{11}$ to $MC_{mn}$ and the reference cells $RC_1$ to $RC_m$ in total form one matrix and are regularly arrayed and formed in a three-dimensional space on a semiconductor substrate 41. The memory cells $MC_{i1}$ to $MC_{in}$ and the reference cell $RC_i$ at row i are arrayed in a single line. The memory cells $M_{1j}$ to $M_{mj}$ at column j and the reference cells $RC_1$ to $RC_m$ are arrayed in straight lines on the semiconductor substrate 41, respectively.

The MTJ elements M included in the at least reference cells $RC_i$ are formed so that axes connecting the free layers MF, the insulating layers MI, and the pinned layers MP are directed in the same direction. It is desirable to also direct the MTJ elements included in the memory cells $MC_{ij}$ in the same direction. In such a configuration, the magnetization directions of the free layers MF can be collectively set by externally applying a magnetic field having an intensity that is equal to or more than a threshold value. In addition, the MTJ elements M can be switched to both the high resistance state and the low resistance state by controlling the direction of the applied magnetic field.

The word lines $WL_1$ to $WL_m$, the bit lines $BL_1$ to $BL_n$, the reference bit line $BL_R$, the source lines $SL_1$ to $SL_n$, the reference source line $SL_R$, the reading load transistors $RT_1$ to $RT_n$, the reference reading load transistor $RT_R$, the reading/writing transistors $RWQ_1$ to $RWQ_n$, the reference reading/writing transistor $RWQ_R$, and the like are also regularly arrayed in the three-dimensional space.

Therefore, when the memory cell $MC_{ij}$ is read, the length of the bit line $BL_j$ between the reading load transistor $RT_j$ and the memory cell $MC_{ij}$ and the length of the reference bit line $BL_R$ between the reference reading load transistor $RT_R$ and the reference cell $RC_i$ are equal to each other. Therefore, the wiring resistances of the bit line $BL_j$ and the reference bit line $BL_R$ are also approximately equal to each other.

Likewise, the length of the source line $SL_j$ between the memory cell $MC_{ij}$ and the reading/writing transistor $RWQ_j$ and the length of the reference source line $SL_R$ between the reference cell $RC_i$ and the reference reading/writing transistor $RWQ_R$ are equal to each other. Therefore, the wiring resistances of the source line $SL_j$ and the reference source line $SL_R$ are also approximately equal to each other.

Operations of the memory circuit 11 including the configuration described above will now be described.

(Initial Setting)

In order to use the memory circuit 11 including the configuration illustrated in FIG. 1, the MTJ elements M included in all the reference cells RC are set to the parallel state (low resistance state), and the resistance values of the reference cells RC are set to a predetermined value.

Two methods of setting the resistance values in such a manner will be described.

(First Method of Applying External Magnetic Field)

Figure 6:
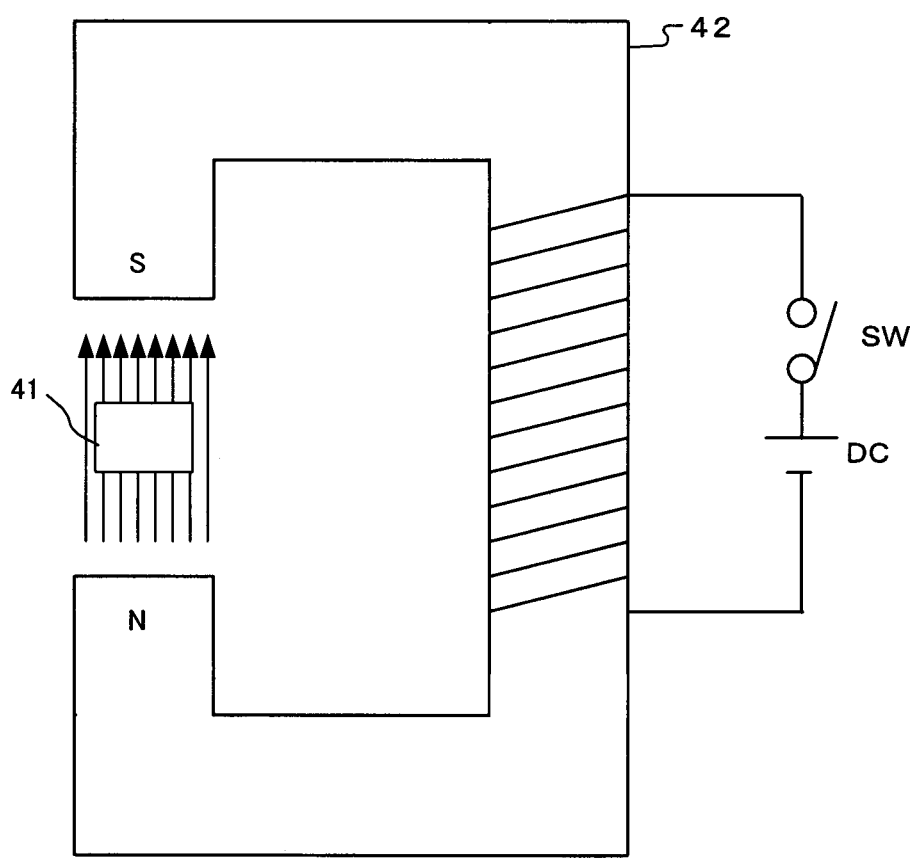
FIG. 6 is a view for explaining a technique of writing initial data into a reference cell illustrated in FIG. 1 by an external magnetic field.

As illustrated in FIG. 6, the semiconductor substrate 41 including the produced memory circuit 11 is arranged in a predetermined direction in the magnetic gap of a magnetic field generator 42. Then, a switch SW is turned on for a given length of time to pass a direct current from a direct-current power source DC to a coil for a given length of time. As a result, a magnetic field having a certain intensity is applied in a given direction, and data "0" is written by setting all the MTJ elements M included in all the reference cells RC in the parallel state (low resistance state). As a result, the resistance values of all the MTJ elements M included in all the reference cells RC are set to $R_p$.

When all the MTJ elements are formed to be directed in the same direction, all the MTJ element can also be set to the same value. Formation of the inversed directions of some MTJ elements also enables "1" to be written only into the some MTJ elements.

(Second Method by Writing Current)

The reference cells RC are set in the low resistance state (parallel state) by passing a write current through the reference cells RC.

First, the reference column decoder 33 sets the reference column line $CL_R$ to a high level. In contrast, the read/write controller 34 sets the writing control signal WBLH to a high level. As a result, the reference NAND gate $NG_R$ outputs a signal of low level. As a result, the reference writing transistor $WTP_R$ is turned on.

In contrast, the row decoder 31 sets the word line $WL_1$ to a high level and the other word lines WL to a ground level under control from a higher-level device. As a result, the reference selection transistor $AT_1$ is turned on.

Thus, a current passes through the reference writing transistor $WTP_R$→the reference bit line $BL_R$→the reference cell $RC_1$→the reference selection transistor $AT_1$→the reference source line $SL_R$→the reference reading/writing transistor $RWQ_R$→a ground. As a result, the current passes through the MTJ element M included in the reference cell $RC_1$, and the magnetization direction of the free layer MF of the MTJ element M becomes the same as the magnetization direction of the pinned layer MP of the MTJ element M as illustrated in portion B of FIG. 2A. Therefore, the resistance between both the terminals of the MTJ element M becomes the low resistance $R_p$.

The row decoder 31 sets the word line $WL_1$ to a low level and the word line $WL_2$ to a high level under control from the higher-level device when the writing of data "0" into the reference cell $RC_1$ is completed after a lapse of a given length of time. As a result, the reference selection transistor $AT_2$ is turned on, and a current passes through the reference writing transistor $WTP_R \rightarrow$ the reference bit line $BL_R \rightarrow$ the reference cell $RC_2 \rightarrow$ the reference selection transistor $AT_2 \rightarrow$ the reference source line $SL_R \rightarrow$ the reference reading/writing transistor $RWQ_R \rightarrow$ the ground. As a result, the current passes through the MTJ element M included in the reference cell $RC_2$, and the resistance between both the terminals of the MTJ element M becomes the low resistance $R_P$.

Afterward, the reference selection transistors $AT_3$ to $AT_m$ are selected in turn in a similar manner, thereby passing currents through the reference cells $RC_3$ to $RC_m$ in turn and writing data "0" into the respective MTJ elements M.

When data "0" is written into all the reference cells $RC_1$ to $RC_m$ in such a manner, initialization processing is completed.

(Reading Operation)

A reading operation will now be described with reference to a timing chart of FIG. 7A-7G.

When data is read from the memory cell $MC_{ij}$ at row i and column j, the column decoder 32 decodes column addresses, and, as illustrated in FIG. 7B, sets the column line $CL_j$ at column j to a high level and maintains the other column lines CL at a low level. The reference column decoder 33 sets the reference column line $CL_R$ to a high level as illustrated in FIG. 7B.

Then, the read/write controller 34 sets the read enable signal RE to a high level as illustrated in FIG. 7C. As a result, both the inputs of the NAND gate $RG_j$ at column j are set to high levels, and the output of the NAND gate $RG_j$ is set to a low level, thereby turning on the reading load transistor $RT_j$. As a result, the bit line $BL_j$ at column j is temporarily charged with the read voltage VR as illustrated in FIG. 7E.

Likewise, both the inputs of the reference NAND gate $RG_R$ are set to high levels, and the output of the reference NAND gate $RG_R$ is set to a low level, thereby turning on the reference reading load transistor $RT_R$. As a result, the reference bit line $BL_R$ is temporarily charged with the read voltage VR as illustrated in FIG. 7F.

In addition, the read enable signal RE which is one input of the OR gate OR is set to a high level, thereby setting the output of the OR gate OR to a high level and turning on the reading/writing transistors $RWQ_1$ to $RWQ_n$. As a result, the source line $SL_j$ at column j is connected to a ground.

Then, the row decoder 31 decodes row addresses, and, as illustrated in FIG. 7A, sets the word line $WL_i$ at row i to a high level and maintains the other word lines WL at low levels. As a result, the selection transistors $ST_i$ and the reference selection transistor $AT_i$ are turned on.

The turning-on of the selection transistors $ST_i$ allows a current to pass through the reading load transistor $RT_j \rightarrow$ the bit line $BL_j \rightarrow$ the memory cell $MC_{ij} \rightarrow$ the source line $SL_j \rightarrow$ the reading/writing transistor $RWQ_j \rightarrow$ the ground. As a result, the voltage of the bit line $BL_j$ gradually changes to a voltage corresponding to the resistance value of the memory cell $MC_{ij}$, as illustrated in FIG. 7E. Specifically, the voltage of the bit line $BL_j$ changes to a relatively high voltage when the resistance value of the MTJ element M included in the memory cell $MC_{ij}$ is a high resistance (stored data is "1") and changes to a relatively low voltage when the resistance value of the MTJ element M is a low resistance (stored data is "0"). The voltage of the bit line $BL_j$ is transmitted to the positive input terminal of the sense amplifier SA via the turned-on column selection transistor $CT_j$ and the vertical bit line VBL because the column line $CL_j$ is at the high level. A voltage drop in the vertical bit line VBL is small because the line width of the vertical bit line VBL is large, and the input impedance of the sense amplifier SA is large.

The turning-on of the reference selection transistor $AT_i$ allows a current to pass through the reference reading load transistor $RT_R \rightarrow$ the reference bit line $BL_R \rightarrow$ the reference cell $RC_i \rightarrow$ the reference selection transistor $AT_i \rightarrow$ the reference source line $SL_R \rightarrow$ the reference reading/writing transistor $RWQ_R \rightarrow$ the ground. As a result, the voltage of the reference bit line $BL_R$ is changed to the reference voltage $V_{ref}$ as illustrated in FIG. 7F. The voltage of the reference bit line $BL_R$ is transmitted to the negative input terminal of the sense amplifier SA via the turned-on reference column selection transistor $CT_R$ because the reference column line $CL_R$ is at a high level.

The sense amplifier SA outputs a DATA signal of high level if the data voltage Vb of the vertical bit line VBL applied to the positive input terminal is higher than the reference voltage $V_{ref}$ applied to the negative input terminal, and outputs a DATA signal of low level if the data voltage Vb of the vertical bit line VBL is lower than the reference voltage $V_{ref}$, as illustrated in FIG. 7G. Data stored in the memory cell $MC_{ij}$ at row i and column j is read by signal processing with the high level as "1" and the low level as "0."

Then, the word line $WL_i$, the read enable signal RE, and the column line $CL_j$ are set in turn to low levels, and one reading cycle is ended.

In the reading operation, the writing control signals WBLH, WBLL, WSLH, and WSLL are maintained at low level, as illustrated in FIG. 7D.

(Writing Operation)

When data is written into the memory cell $MC_{ij}$ at row i and column j, the column decoder 32 decodes the column addresses, and, as illustrated in FIG. 8B and FIG. 9B, sets the column line $CL_j$ at column j to a high level and maintains the other column lines CL at low levels.

The read/write controller 34 controls the writing control signals WBLH, WBLL, WSLH, and WSLL in response to write data.

First, an operation in the case of writing "0" will be described.

In this case, the read/write controller 34 sets the writing control signals WBLH and WSLL to high levels as illustrated in FIG. 8C and maintains the writing control signals WBLL and WSLH at low levels as illustrated in FIG. 8D. The setting of both the column line $CL_j$ and the writing control signal WBLH to the high levels allows the output of the writing NAND gate $NG_j$ at column j to be at a low level. Therefore, the writing transistor $WTP_j$ is turned on. As a result, the bit line $BL_j$ is set to a write voltage as illustrated in FIG. 8E.

The setting of the writing control signal WSLL to the high level allows the output of the OR gate OR to be set to a high level, allows the reading/writing transistor $RWQ_j$ to be turned on, and allows the source line $SL_j$ to be grounded as illustrated in FIG. 8F.

Then, the row decoder 31 decodes the row addresses, and, as illustrated in FIG. 8A, sets the word line $WL_i$ at row i to a high level and maintains the other word lines WL at low levels. As a result, the selection transistors $ST_i$ are turned on.

As a result, a current passes through the writing transistor $WTP_j \rightarrow$ the bit line $BL_j \rightarrow$ the memory cell $MC_{ij} \rightarrow$ the source line $SL_j \rightarrow$ the reading/writing transistor $RWQ_j \rightarrow$ the ground. As a result, the current passes through the MTJ element M included in the memory cell $MC_{ij}$, the MTJ element M is set in a parallel state, and the resistance value of the MTJ element M becomes a low resistance. In other words, data "0" is written.

An operation in the case of writing data "1" will now be described.

In this case, the read/write controller 34 sets the writing control signals WBLL and WSLH to high levels as illustrated in FIG. 9D and maintains the writing control signals WBLH and WSLL at low levels as illustrated in FIG. 9C. The setting of both the column line $CL_j$ and the writing control signal WBLL to the high levels allows the output of the AND gate $AG_j$ at column j to be at a high level. As a result, the writing transistor $WTN_j$ is turned on.

The setting of the writing control signal WSLH to the high level allows the output of the inverter IN to be set to a low level, allows the writing transistor $WQ_j$ to be turned on, and allows a write voltage VW to be applied to the source line $SL_j$ as illustrated in FIG. 9F.

Then, the row decoder 31 decodes the row addresses, and, as illustrated in FIG. 9A, sets the word line $WL_i$ at row i to a high level and maintains the other word lines WL at low levels. As a result, the selection transistors $ST_i$ are turned on.

Therefore, a current passes through the writing transistor $WQ_j \rightarrow$ the source line $SL_j \rightarrow$ the memory cell $MC_{ij} \rightarrow$ the bit line $BL_j \rightarrow$ the writing transistor $WTN_j \rightarrow$ the ground. As a result, the current passes through the MTJ element M included in the memory cell $MC_{ij}$, the MTJ element M is set in an antiparallel state, and the resistance value of the MTJ element M becomes a high resistance. In other words, data "1" is written.

Then, the word line $WL_i$, the column line $CL_j$, the writing control signal WBLL, and the writing control signal WSLH are set in turn to low levels, and writing processing corresponding to one cycle is ended.

As described above, the memory circuit 11 according to the present embodiment has the following features.

1) Neither complicated configuration nor complicated operation is required for writing data into such a reference cell RC in an initial state.

2) The MTJ element included in the reference cell is formed in the same configuration and step as the configuration and step of the MTJ element included in such a memory cell. Therefore, the reference cell and the memory cell are similarly influenced by, for example, a change in environment or the unevenness of a production step. Therefore, when the resistance value of the MTJ element M included in the memory element MC varies due to the influence of an environment or a step so as to be less (more) than a desired value, the resistance value of the MTJ element M included in the reference cell RC also varies so as to be less (more) than a desired value. A variation in the resistance value of the memory cell MC and a variation in the resistance value of the reference cell RC tend to be the same as each other, and therefore, the variations are canceled out by differential operation of the sense amplifier SA. Therefore, a malfunction can be suppressed.

3) When the memory cell $MC_{ij}$ is read-accessed, the reference cell $RC_i$ is accessed. The length of the bit line $BL_j$ between the memory cell $MC_{ij}$ and the reading load transistor $RT_j$ and the length of the reference bit line $BL_R$ between the reference cell $RC_i$ and the reference reading load transistor $RT_R$ are approximately equal to each other. Likewise, the length of the source line $SL_j$ between the memory cell $MC_{ij}$ and the reading/writing transistor $RWQ_j$ and the length of the reference source line $SL_R$ between the reference cell $RC_i$ and the reference reading/writing transistor $RWQ_R$ are approximately equal to each other. In addition, the sizes and characteristics of the transistors connected to the bit line $BL_j$ and the sizes and characteristics of the transistors connected to the reference bit line $BL_R$ are equal to each other. Therefore, a malfunction and a false determination due to the unevenness of wiring and the resistances of the elements are precluded.

4) In the configuration of this embodiment, one reference cell $RC_j$ is arranged correspondingly to n memory cells MC at the same row. Therefore, each reference cell RC is read-accessed on average n times, typically 100 times to 1,000 times, more frequently than each memory cell MC.

Such repeated read access may result in read disturb which is rewriting of data stored in such a reference cell RC due to a read current. In this embodiment, the MTJ element M included in each reference cell RC is connected in a direction in which "0" is written due to a current passing at the time of reading (in parallel state). Therefore, no read disturb occurs. Therefore, a malfunction due to the read disturb can be suppressed, and the need for performing maintenance of data stored in the reference cells RC can be eliminated.

In order to confirm the effectiveness in this embodiment, the effective reading signal voltage ΔVeff of each memory cell was calculated from the following equation.

$$\Delta Veff = \text{memory cell read voltage} - \text{reference voltage}$$

Figure 10A:
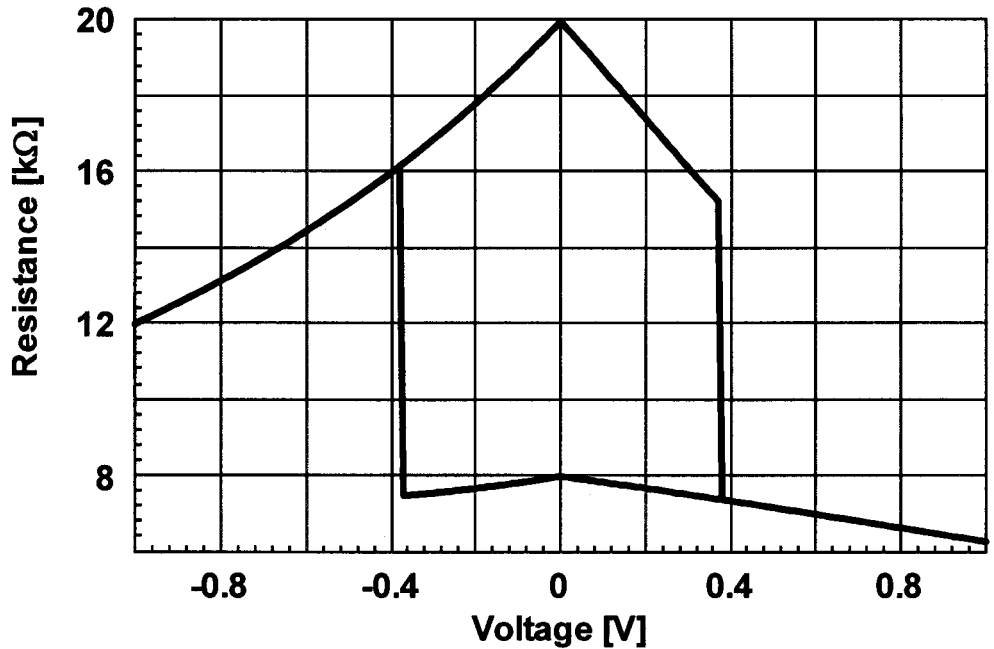
FIG. 10A is a graph illustrating the temperature performance of an MTJ element used in a simulation.
Figure 10B:
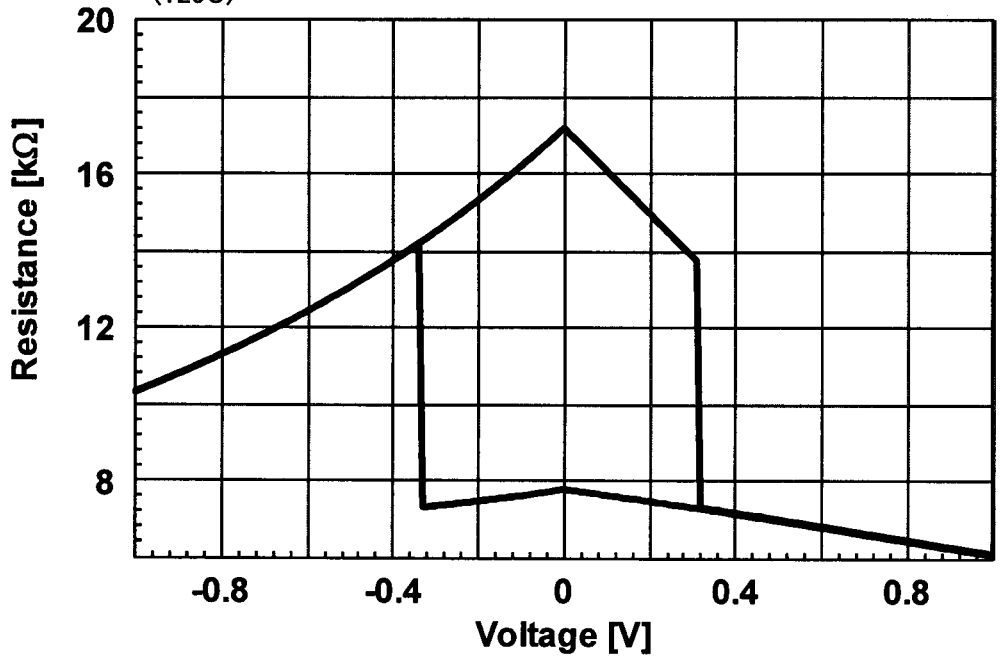
FIG. 10B is a graph illustrating the temperature performance of the MTJ element used in the simulation.

The more ΔVeff results in the larger acceptable range of a signal voltage and the more advantageous operation of each memory cell. The ΔVeff of each memory cell was calculated using a Monte Carlo circuit simulation on the assumption that the resistance of each MTJ element M has a variance of a normal distribution with a standard deviation σ. In addition, the characteristics of the MTJ element commonly differ according to variations in temperature. Therefore, MTJ elements having characteristics in FIG. 10A and characteristics in FIG. 10B at a room temperature of 25° C. and a high temperature of 125° C., respectively, were assumed. For comparisons with a conventional technology, ΔVeff in a configuration disclosed in Patent Literature 1 was calculated under the same conditions.

Figure 11A:
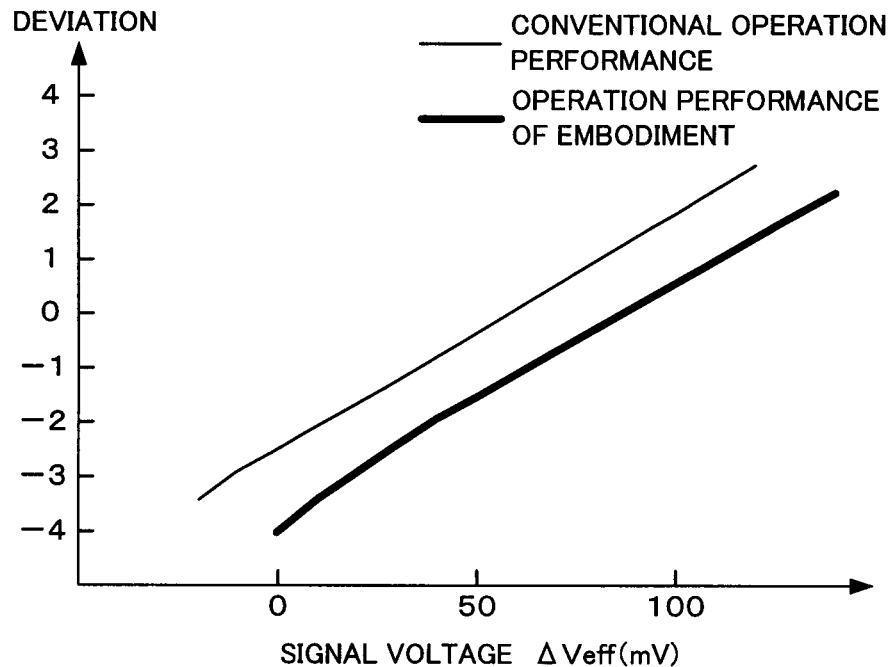
FIG. 11A is a graph illustrating operation performance at a room temperature with regard to reading of data from a memory cell in the memory circuit illustrated in FIG. 1.
Figure 11B:
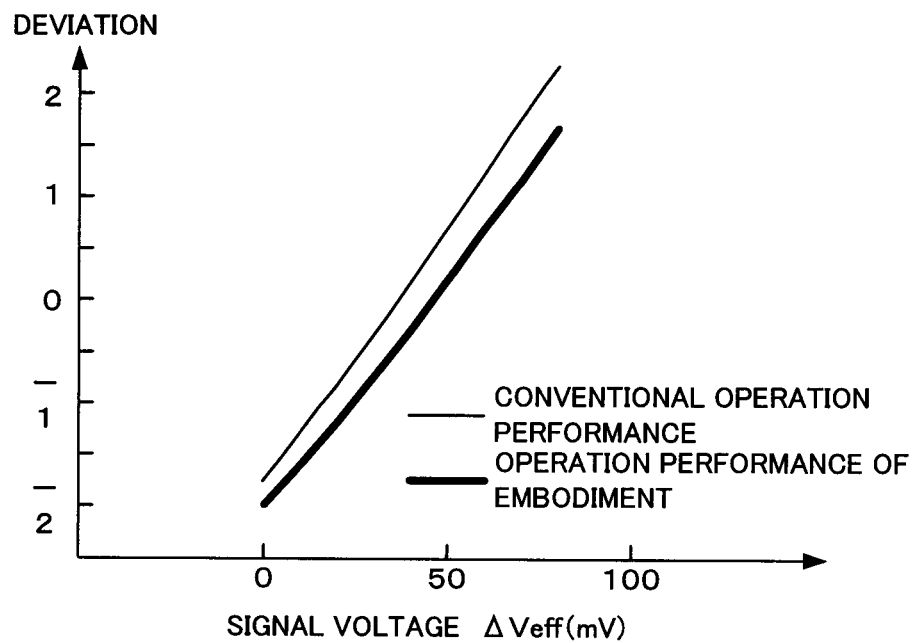
FIG. 11B is a graph illustrating operation performance at a high temperature with regard to reading of data from a memory cell in the memory circuit illustrated in FIG. 1.

FIGS. 11A and 11B illustrate graphs of the cumulative frequency distributions of ΔVeff of each memory cell, calculated at the respective temperatures.

On the basis of FIGS. 11A and 11B, acceptable ranges at the room temperature and the high temperature in this embodiment are expected to increase by on average approximately 50% and on average approximately 25%, respectively, relative to those in the conventional technology.

As described above, the memory circuit according to the present embodiment exhibited superiority over the conventional memory circuit at the room temperature. The memory circuit according to the present embodiment is also similarly superior to the conventional memory circuit at the high temperature. Therefore, data can stably be stored and read regardless of variations in temperature.

The present disclosure is not limited to the embodiment described above, but various modifications and applications may be made.

Figure 12A:
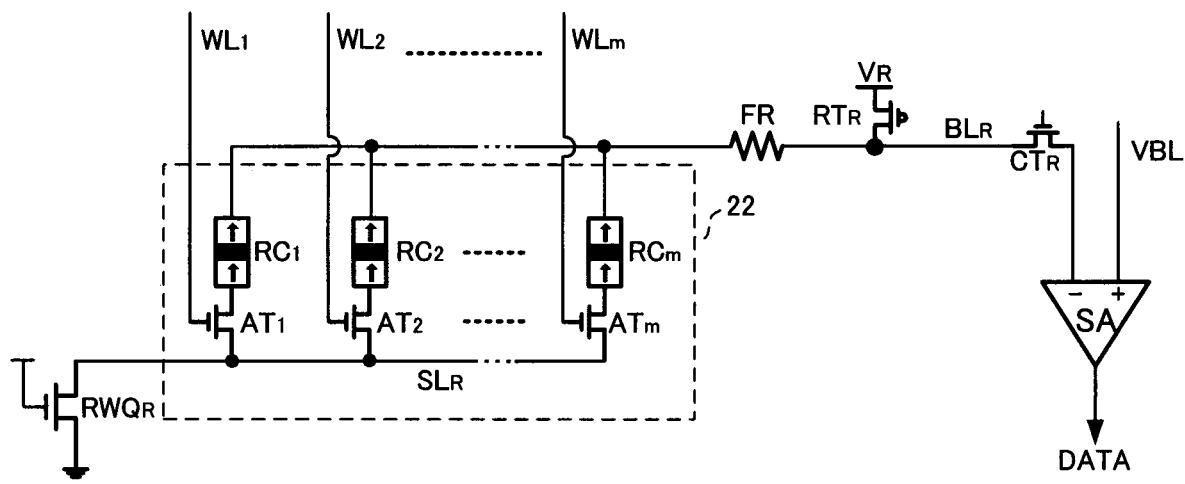
FIG. 12A is a view illustrating an alternative example of a reference cell array of a memory circuit.

For example, each reference cell $RC_i$ includes the fixed resistor FR and the MTJ element M in the embodiment described above. This disclosure is not limited thereto. For example, a common use of a fixed resistor FR can also be made in plural reference cells $RC_i$, as illustrated in FIG. 12A.

In this configuration, each reference cell $RC_i$ includes one MTJ element M.

One end of the fixed resistor FR is connected in common to one ends of reference cells $RC_1$ to $RC_m$ via a reference bit line $BL_R$.

The other end of the fixed resistor FR is connected to the negative input terminal of a sense amplifier SA via the reference bit line $BL_R$ and a reference column selection transistor $CT_R$.

In this configuration, a criterion resistance value which is the criterion of reading is obtained by connecting in series a reference cell $RC_i$ selected by a reference selection transistor $AT_i$ and the fixed resistor FR.

Therefore, a reference circuit includes: the matrix of the reference cells RC each including an MTJ element that includes the same configuration as the configuration of an MTJ element included in a memory cell $MC_{ij}$ and that is set to a low resistance $R_p$; and the linear resistor (fixed resistor) FR. In addition, a reference voltage conversion circuit includes: the reference bit line $BL_R$; a reference reading load transistor $RT_R$ that is connected to the reference bit line $BL_R$; and a reference selection transistor $AT_i$ that selects a reference cell $RC_i$ located apart from the reference reading load transistor $RT_R$ by a distance corresponding to a distance between a memory cell $MC_{ij}$ to be accessed and a reading load transistor $RT_j$.

Figure 12B:
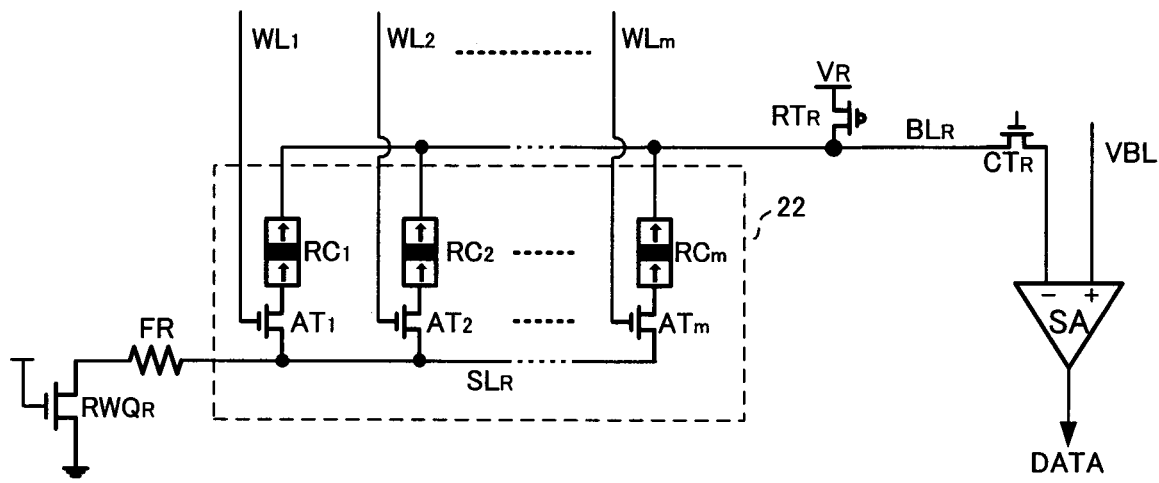
FIG. 12B is a view illustrating an alternative example of a reference cell array of a memory circuit.

The fixed resistor FR inserted into the reference bit line $BL_R$ in the circuit configuration of FIG. 12A may also be arranged in a reference source line $SL_R$ as illustrated in FIG. 12B. In this case, the fixed resistor FR is connected between a ground and the point connecting the reference source line $SL_R$ to a reference cell $RC_1$ closest to a reference reading/writing transistor $RWQ_R$. In other words, the fixed resistor FR is connected between the common connection point of the other end of the reference cell RC and the grounding end.

A reference writing transistor $WTP_R$ connected to a reference bit line $BL_R$ is unnecessary in a case in which initial data ("0") is written into a reference cell RC only by an external magnetic field.

In the embodiment described above, data "0" and data "1" are assigned to the low and high resistances of each MTJ element, respectively. However, data "1" and data "0" may also be assigned to the low and high resistances of each MTJ element, respectively.

The memory cell array 21 and the reference cell array 22 are optionally arranged.

Figure 13:
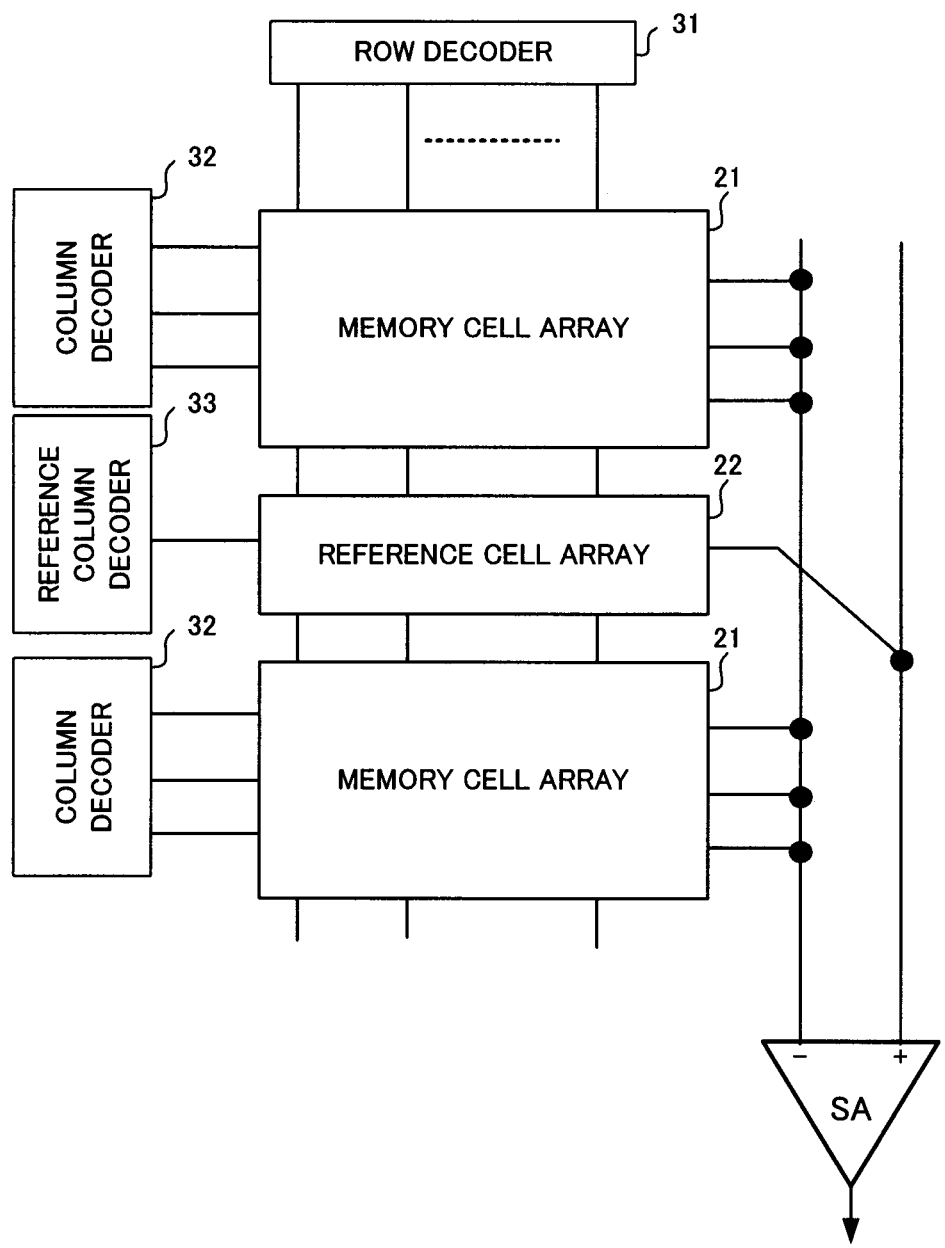
FIG. 13 is a view illustrating an alternative example of a configuration of a memory circuit.

For example, the memory cell array 21 may be divided into two blocks, and the reference cell array 22 may be arranged between the blocks, as illustrated in FIG. 13. Such a configuration enables suppression of variations in a wiring resistance between a memory cell and a sense amplifier SA and in a wiring resistance between a reference cell and the sense amplifier SA due to the position of the memory cell in a column direction.

In FIG. 13, reference cells are connected to the positive input terminal of the sense amplifier SA.

Figure 14:
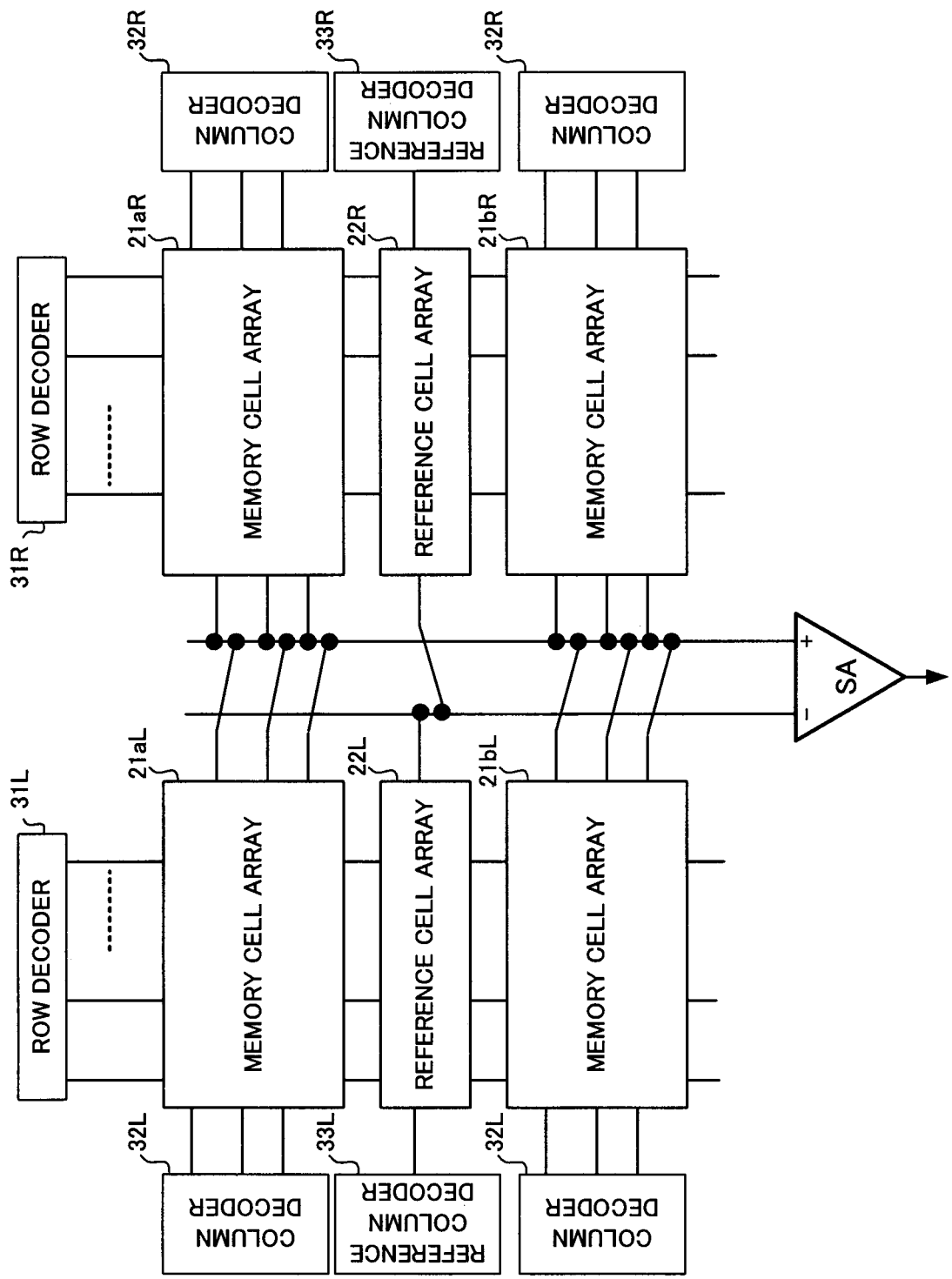
FIG. 14 is a view illustrating an alternative example of a configuration of a memory circuit.

As illustrated in FIG. 14, a sense amplifier SA may be interposed between two arrays L and R into which each of the memory cell arrays 21 and the reference cell array 22 is divided.

The circuit configurations, timing charts, and operations of the memory circuit 11 are illustrative examples, but are not limited thereto. The logic of the circuit, and the like are also optional. For example, a column selection transistor $CT_j$ may carry out the logical AND between a column line $CL_j$ and a read enable signal RE and may apply the logical AND to a gate.

Although the selection transistor $ST_i$ is arranged to be closer to the source line $SL_j$ than the memory cell $MC_{ij}$ in the configuration of FIG. 1, the order of arrangement thereof is optional. Likewise, although the reference selection transistor $AT_i$ is arranged to be closer to the reference source line $SL_R$ than the reference cell $RC_i$ in the configurations of FIG. 1 and FIGS. 12A and 12B, the order of arrangement thereof is optional.

In addition, a storage element into which write data is written is not limited to the MTJ elements, but may be a variable-resistance storage element such as a resistive random access memory (ReRAM).

In such a case, a variable-resistance element included in a reference circuit is also allowed to include the same configuration as the configuration of a variable-resistance element included in a storage cell and to be set to a low resistance RL. In addition, the resistance value of a linear resistor FR is allowed to be more than 0 and to be less than the difference between the high resistance RH and low resistance RL of the variable-resistance element. In particular, it is desirable that the resistance value of the linear resistor FR is substantially equal to $(\alpha/100) \times RL$. In such a case, $\alpha$ is the upper limit value (%) of variations in the resistance value of the variable-resistance element, acceptable from the resolution of a sense amplifier used in this memory circuit (minimum difference value which can be sensed between the voltage of a positive input terminal and the voltage of a negative input terminal). In such a case, both configurations are possible in which a fixed resistor is arranged according to each reference cell as illustrated in FIG. 1 and in which one fixed resistor is arranged (used in common) according to plural reference cells (variable-resistance elements) as illustrated in FIGS. 12A and 12B.

The present disclosure is not limited by the description of the embodiments and the drawings as described above, and modifications may be made to the embodiments and the drawings as appropriate.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

The present application is based on Japanese Patent Application No. 2015-100542, filed on May 15, 2015, and includes the specification, claims, drawings, and abstract thereof. The entire disclosure of the Japanese patent application is incorporated herein by reference.

REFERENCE SIGNS LIST

11 Memory circuit
21 Memory cell array
22 Reference cell array
31 Row decoder
32 Column decoder
33 Reference column decoder
34 Read/write controller
41 Semiconductor substrate
42 Magnetism generator
51 Semiconductor layer
52 Diffusion layer
53 Substrate
54 Polycrystalline silicon layer CL$_1$ to CL$_n$ Column line
CL$_R$ Reference column line
WL$_1$ to WL$_m$ Word line
BL$_1$ to BL$_n$ Bit line
BL$_R$ Reference bit line
VBL Vertical bit line
ST$_{11}$ to ST$_{mn}$ Selection transistor
AT$_1$ to AT$_m$ Reference selection transistor
SL$_1$ to SL$_n$ Source line
SL$_R$ Reference source line
RT$_1$ to RT$_n$ Reading load transistor
RT$_R$ Reference reading load transistor
CT$_1$ to CT$_n$ Column selection transistor
CT$_R$ Reference column selection transistor
WTP$_1$ to WTP$_n$ Writing transistor
WTP$_R$ Reference writing transistor
WTN$_1$ to WTN$_n$ Writing transistor
WQ$_1$ to WQ$_n$ Writing transistor
RWQ$_1$ to RWQ$_n$ Reading/writing transistor
RWQ$_R$ Reference reading/writing transistor
RG$_1$ to RG$_n$ NAND gate
RG$_R$ Reference NAND gate
NG$_1$ to NG$_n$ NAND gate
NG$_R$ Reference NAND gate
AG$_1$ to AG$_n$ AND gate
OR OR gate
IN Inverter
SA Sense amplifier
VR Read voltage
VW Write voltage

The invention claimed is:

1. A memory circuit, comprising:
memory cells arranged in a form of a matrix, each memory cell comprising a variable-resistance element in which a resistance value varies substantially between two levels;
a resistance-voltage conversion circuit comprising at least one bit line, at least one load transistor connected to the at least one bit line, and a selector for selecting a memory cell to be accessed, the at least one bit line being arranged in a column of the matrix of the memory cells and being connected to a memory cell; in the column,
a reference circuit comprising a matrix of reference cells each comprising a series circuit of a variable-resistance element and a linear resistor, the variable-resistance element comprising substantially a same configuration as a configuration of the variable-resistance element included in each memory cell and being set to a lower resistance of two levels;
a reference voltage conversion circuit for converting a resistance value of the reference circuit into a reference voltage, the reference voltage conversion circuit comprising:
a reference bit line connected to each of the reference cells,
a reference load transistor connected to the reference bit line, and
a selector for selecting a reference cell located apart from the reference load transistor by a distance corresponding to a distance between a memory cell to be accessed and the load transistor; and
a sense amplifier for determining data stored in the memory cell by comparing the data voltage of the bit line with the reference voltage of the reference bit line,
wherein the variable-resistance element is settable to either a high resistance RH or a low resistance RL, and
the linear resistor included in the reference circuit has a resistance value of more than 0 and less than a difference (RH−RL) between the high resistance RH and the low resistance RL.

2. The memory circuit according to claim 1, wherein when α is assumed to be an upper limit value of variations in a resistance value of a variable-resistance element, acceptable from a resolution of the sense amplifier, the resistance value of the linear resistor is substantially equal to (α/100)×RL.

3. The memory circuit according to claim 1, wherein the linear resistor is interposed between a point connecting the reference bit line to a reference cell that is closest to a reference load transistor of the plurality of reference cells and a point connecting the reference bit line to the reference load transistor or interposed between a common connection point of another end of a reference cell and a grounding end.

4. The memory circuit according to claim 1, wherein the variable-resistance element included in each reference cell is connected to the reference bit line so that a low resistance state of the variable-resistance element is maintained when a read current passes.

5. The memory circuit according to claim 1, wherein an array of the reference cells is arranged between memory cell arrays.

6. The memory circuit according to claim 5, wherein the plurality of variable-resistance elements included in the reference circuit comprise magnetic tunneling junction elements arranged to be oriented in a same direction.

7. The memory circuit according to claim 6, wherein the magnetic tunneling junction elements included in the reference circuit are set to a low resistance by application of a magnetic field.

8. The memory circuit according to claim 3, wherein an array of the reference cells is arranged between memory cell arrays.

9. The memory circuit according to claim 8, wherein the plurality of variable-resistance elements included in the reference circuit comprise magnetic tunneling junction elements arranged to be oriented in a same direction.

10. The memory circuit according to claim 9, wherein the magnetic tunneling junction elements included in the reference circuit are set to a low resistance by application of a magnetic field.

* * * * *